(12) United States Patent
Kim et al.

(10) Patent No.: US 9,754,650 B2
(45) Date of Patent: Sep. 5, 2017

(54) MEMORY DEVICE AND SYSTEM SUPPORTING COMMAND BUS TRAINING, AND OPERATING METHOD THEREOF

(71) Applicant: Samsung Electronics Co., Ltd., Suwon-si (KR)

(72) Inventors: Hye-Ran Kim, Hwaseong-si (KR); Tae-Young Oh, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/187,967

(22) Filed: Jun. 21, 2016

(65) Prior Publication Data

US 2017/0110169 A1    Apr. 20, 2017

(30) Foreign Application Priority Data

Oct. 20, 2015   (KR) .......................... 10-2015-0146097

(51) Int. Cl.
*G11C 7/22*    (2006.01)
*G11C 7/12*    (2006.01)

(52) U.S. Cl.
CPC ............. *G11C 7/222* (2013.01); *G11C 7/12* (2013.01)

(58) Field of Classification Search
USPC ............................ 365/189.07; 711/167, 105
See application file for complete search history.

(56) References Cited

U.S. PATENT DOCUMENTS

| | | | | |
|---|---|---|---|---|
| 5,083,296 A * | 1/1992 | Hara | ....................... | G11C 5/066 365/222 |
| 5,339,395 A * | 8/1994 | Pickett | ................... | G06F 13/385 370/463 |
| 5,404,338 A * | 4/1995 | Murai | ................... | G11C 7/1072 365/189.05 |
| 5,602,798 A * | 2/1997 | Sato | ...................... | G11C 7/1072 365/194 |
| 5,936,912 A * | 8/1999 | Kawabata | ............ | G11C 7/1072 327/156 |
| 6,147,927 A * | 11/2000 | Ooishi | .................... | G11C 5/145 365/191 |
| 6,169,702 B1 * | 1/2001 | Hoang | ..................... | G11C 8/06 365/194 |
| 6,181,174 B1 * | 1/2001 | Fujieda | .................... | G06F 1/08 327/158 |

(Continued)

OTHER PUBLICATIONS

Song et al. / A 1.1V 2Y-NM 4.35 GB/S/PIN 8 GB LPDDR4 Mobile Device With Bandwidth Improvement Techniques / 2014 IEEE / 4 Pages.

*Primary Examiner* — Vu Le
*Assistant Examiner* — Sung Cho
(74) *Attorney, Agent, or Firm* — Muir Patent Law, PLLC

(57) ABSTRACT

A memory device and system supporting command bus training are provided. An operating method of the memory device includes entering into a command bus training mode, receiving a clock signal, a chip selection signal and a first command/address signal, generating an internal clock signal by dividing the clock signal, generating a second command/address signal by latching the first command/address signal at a rising edge or a falling edge of the internal clock signal when a chip selection signal is activated, and outputting the second command/address signal.

18 Claims, 21 Drawing Sheets

(56) References Cited

U.S. PATENT DOCUMENTS

| | | | |
|---|---|---|---|
| 6,188,641 B1* | 2/2001 | Uchida | G11C 7/1072 365/189.05 |
| 6,198,689 B1* | 3/2001 | Yamazaki | G11C 7/1072 327/156 |
| 6,230,280 B1* | 5/2001 | Okasaka | G11C 5/145 713/400 |
| 6,337,589 B1* | 1/2002 | Ooishi | G11C 7/22 327/156 |
| 6,351,433 B1* | 2/2002 | Kosugi | G11C 7/1039 365/189.07 |
| 6,389,522 B1* | 5/2002 | Usami | G06F 13/4243 711/167 |
| 6,480,946 B1* | 11/2002 | Tomishima | G11C 5/063 711/167 |
| 6,845,460 B2 | 1/2005 | Lee et al. | |
| 6,973,001 B1* | 12/2005 | Tomita | G11C 7/1072 365/189.05 |
| 7,818,527 B2* | 10/2010 | Kang | G11C 7/10 711/154 |
| 7,889,595 B2 | 2/2011 | Park | |
| 7,969,799 B2 | 6/2011 | Butt et al. | |
| 8,055,930 B2 | 11/2011 | Bae et al. | |
| 8,125,251 B2 | 2/2012 | Park | |
| 8,139,430 B2 | 3/2012 | Buchmann et al. | |
| 8,242,819 B2* | 8/2012 | Bae | G11C 7/22 327/147 |
| 8,458,507 B2 | 6/2013 | Salmon et al. | |
| 8,879,342 B2 | 11/2014 | Jeon | |
| 2004/0193777 A1* | 9/2004 | LaBerge | G06F 13/4022 711/5 |
| 2005/0141333 A1* | 6/2005 | Fujisawa | G11C 7/1066 365/233.1 |
| 2007/0260841 A1* | 11/2007 | Hampel | G06F 13/1684 711/167 |
| 2008/0013663 A1* | 1/2008 | Cornelius | G11C 7/22 375/372 |
| 2009/0016120 A1* | 1/2009 | Kinoshita | G11C 7/1072 365/189.05 |
| 2010/0177583 A1* | 7/2010 | Koshizuka | G11C 5/04 365/222 |
| 2012/0117338 A1* | 5/2012 | Vaidyanath | G06F 13/1689 711/154 |
| 2012/0185663 A1* | 7/2012 | Yokoya | G06F 1/3275 711/167 |
| 2012/0250433 A1* | 10/2012 | Jeon | G11C 8/18 365/193 |
| 2012/0327728 A1* | 12/2012 | Anderson | G11C 7/00 365/191 |
| 2013/0097445 A1* | 4/2013 | Palaniappan | G06F 1/3275 713/323 |
| 2013/0182524 A1* | 7/2013 | Jeon | G11C 7/222 365/233.11 |
| 2014/0181390 A1* | 6/2014 | Bains | G11C 7/1045 711/105 |
| 2014/0241082 A1* | 8/2014 | Tam | G11C 7/222 365/194 |
| 2014/0254295 A1* | 9/2014 | Shim | G11C 7/1072 365/194 |
| 2014/0289574 A1* | 9/2014 | Tsern | G11C 29/50016 714/718 |
| 2015/0380069 A1* | 12/2015 | Matsui | G11C 11/4076 365/191 |

* cited by examiner

MEMORY DEVICE AND SYSTEM SUPPORTING COMMAND BUS TRAINING, AND OPERATING METHOD THEREOF

CROSS-REFERENCE TO RELATED APPLICATION

This application claims priority under 35 USC §119 to Korean Patent Application No. 10-2015-0146097, filed on Oct. 20, 2015, in the Korean Intellectual Property Office, the disclosure of which is incorporated herein in its entirety by reference.

BACKGROUND

The present disclosure relates to command bus training, and more particularly, to a memory device and system supporting command bus training, and an operating method thereof.

To support a high speed interface with a memory device, a memory controller may provide a clock signal to the memory device. The memory device may process signals received from the memory controller in response to the clock signal received from the memory controller, and may synchronize signals to be transmitted to the memory controller with the clock signal. Due to demands for a high data transmission speed, a frequency of a clock signal provided from the memory controller may increase. Also, it has become important to accurately capture signals transferred between the memory controller and the memory device. Thus, the memory device and the memory controller may typically implement a bus training method.

SUMMARY

The present disclosure provides a memory device and system supporting command bus training having improved accuracy, and an operating method thereof.

According to an aspect of the present disclosure, there is provided a command bus training method in a system in which a command/address signal and a clock signal are provided to a memory device from a memory controller. The command bus training method includes entering into a command bus training mode at the memory device, generating an internal clock signal in the memory device by dividing the clock signal, transmitting a first command/address signal by the memory controller, transmitting a chip selection signal by the memory controller, the chip selection signal having an adjustable delay with respect to the internal clock signal, generating and transmitting by the memory device a second command/address signal by latching the first command/address signal at a rising edge or a falling edge of the internal clock signal, when the chip selection signal is activated, comparing the first command/address signal with the second command/address signal by the memory controller, and determining a delay of the chip selection signal based on a plurality of comparison results corresponding to the adjustable delay of the chip selection signal.

According to another aspect of the present disclosure, there is provided an operating method of a memory device supporting command bus training. The operating method includes entering into a mode of the command bus training, receiving a clock signal, a chip selection signal and a first command/address signal, generating first and second internal clock signals by dividing the clock signal, each of the first and second internal clock signals having the same frequency and different phases with respect to each other, generating a second command/address signal by latching the first command/address signal at a rising edge or a falling edge of one of the first and second internal clock signals when the chip selection signal is activated, and outputting the second command/address signal.

According to still another aspect of the present disclosure, there is provided a method of command bus training for a semiconductor device. The method includes receiving a clock signal having a first frequency, generating internal clock signals based on the clock signal, each of the internal clock signals having a second frequency and different phases with respect to each other, wherein the second frequency is smaller than the first frequency, a) receiving a first command/address signal having variable delays with respect to a first internal clock signal of the internal clock signals, b) generating a second command/address signal based on the first command/address signal and the first internal clock signal, c) comparing the first command/address signal with the second command/address signal, repeating a), b), and c) with a different delay of the variable delays, and determining a delay of the first command/address signal based on the comparison results.

BRIEF DESCRIPTION OF THE DRAWINGS

Embodiments of the present disclosure will be more clearly understood from the following detailed description taken in conjunction with the accompanying drawings in which:

FIG. 11 is an exemplary timing diagram of signals transferred between the memory device and the memory controller of FIG. 9B during command bus training, according to exemplary embodiments;

DETAILED DESCRIPTION OF THE EMBODIMENTS

Figure 1:
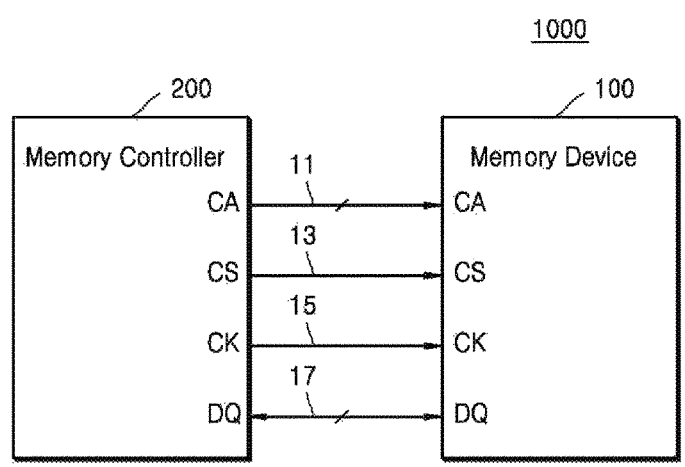
FIG. 1 is a block diagram of a system including a memory device and a memory controller according to example embodiments.

Hereinafter, the present disclosure will now be described more fully with reference to the accompanying drawings, in which exemplary embodiments of the present disclosure are shown. Like reference numerals in the drawings denote like elements, and a repeated explanation will not be given of overlapping features. This present disclosure may, however, be embodied in different forms and should not be construed as limited to the embodiments set forth herein. It should be understood that exemplary embodiments of the present disclosure are to cover all modifications, equivalents, and alternatives falling within the spirit and scope of the present disclosure. In the attached drawings, sizes of structures may be exaggerated for clarity. As used herein, the term "and/or" includes any and all combinations of one or more of the associated listed items. Expressions such as "at least one of," when preceding a list of elements, modify the entire list of elements and do not modify the individual elements of the list.

The terminology used herein is for describing particular embodiments and is not intended to be limiting of exemplary embodiments. It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meanings as commonly understood in the art to which the exemplary embodiments belong. It will be further understood that the terms such as those defined in commonly used dictionaries should be interpreted as having meanings consistent with their meanings in the context of the relevant art and will not be interpreted in an idealized or overly formal sense unless expressly so defined herein.

FIG. 1 is a block diagram of a system 1000 including a memory device 100 and a memory controller 200 according to example embodiments. As illustrated in FIG. 1, the system 1000 may include the memory device 100 and the memory controller 200, and may be referred to as a memory system.

As used herein, a semiconductor device may refer to various items such as a memory device, one or more logic devices or memory cells formed in or on a semiconductor substrate, a semiconductor chip, a memory chip, a memory die, a logic chip, a package, a package including one or memory chips and optionally one or more logic chips, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

The memory device 100 may include a memory cell array including a plurality of memory cells. According to example embodiments, the memory cells may be volatile memory cells, and the memory device 100 may include, but is not limited to, dynamic random access memory (DRAM), static random access memory (SRAM), mobile DRAM, double data rate synchronous dynamic random access memory (DDR SDRAM), low power DDR (LPDDR) SDRM, graphic DDR (GDDR) SDRAM, rambus dynamic random access memory (RDRAM), etc. According to example embodiments, the memory cells may be non-volatile memory cells, and the memory device 100 may include, but is not limited to, electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), etc. Hereinafter, it is described that the memory device 100 is DRAM. However, the present disclosure is not limited thereto.

The memory controller 200 may receive a request of access to the memory device 100 from a host (not shown), and may communicate with the memory device 100 in response to the received request. Although the memory controller 200 is illustrated as a separate component in FIG. 1, the memory controller 200 may be included in other separate components, such as a processor, etc. according to exemplary embodiments.

Referring to FIG. 1, in order to reduce the number of signal lines between the memory device 100 and the memory controller 200, a command and an address may be transmitted as a command/address signal CA to the memory device 100 from the memory controller 200 through a command/address bus 11. A chip selection signal CS may be transmitted to the memory device 100 from the memory controller 200 through a chip selection line 13. An activated chip selection signal CS may indicate that the command/address signal CA transmitted through the command/address bus 11 is a command, and a deactivated chip selection signal CS may indicate that the command/address signal CA transmitted through the command/address bus 11 is an address. A data signal (or data) DQ may be transmitted to the memory device 100 from the memory controller 200 or may be transmitted to the memory controller 200 from the memory device 100, through a data bus 17 including bi-directional signal lines.

When a data storage capacity of the memory device 100 increases, and devices accessing the memory device 100, such as a central processing unit (CPU), a graphics processing unit (GPU), an intellectual property (IP) core, etc., have increased operating speeds, the memory device 100 may support a high-speed interface. For example, as illustrated in FIG. 1, the memory device 100 may receive a clock signal CK from the memory controller 200 through a clock line 15, and based on the received clock signal CK, may capture signals received from the memory controller 200, such as the command/address signal CA, the chip selection signal CS, the data signal DQ, etc. Also, the memory device 100 may transmit the data signal DQ synchronized with the received clock signal CK to the memory controller 200 so that the memory controller 200 can capture the data signal DQ. FIG. 1 illustrates an example in which the clock signal CK is transmitted through one clock line 15. However, the clock signal CK may be differentially transmitted through two signal lines. Hereinafter, it is described that the memory device 100 operates in synchronization with a rising edge of the clock signal CK. However, the memory device 100 may operate in synchronization with a falling edge of the clock signal CK, according to exemplary embodiments.

In order to capture the command/address signal CA, the chip selection signal CS, and the data signal DQ based on the clock signal CK having a high frequency, the memory device 100 and the memory controller 200 may support a bus training mode. That is, the memory controller 200 may perform bus training with respect to the command/address bus 11, the chip selection line CS, and/or the data bus 17, when a power supply voltage is supplied to the system 1000 or a specific condition is met. For example, the memory controller 200 may transmit a command entering into the bus training mode to the memory device 100 through the command/address bus 11 together with the clock signal CK having low frequency, and the memory device 100 may enter into the bus training mode. In the bus training mode, the memory controller 200 may transmit a specific signal to the memory device 100 through a signal line which is subject to training, together with the clock signal CK having high frequency, and may receive a response from the memory device 100. The memory controller 200 may determine a timing (e.g. a delay) of the signal transmitted through the training subject signal line, based on the response received from the memory device 100.

Data bus training may be performed by determining whether the data signal DQ transmitted through the data bus 17 at a rising edge of the clock signal CK is accurately captured by the memory device 100, after a certain period of time has passed after the memory controller 200 transmits a specific command through the command/address bus 11. Meanwhile, command bus training may be performed before the data bus training is performed, and may be performed by determining whether the command/address signal CA transmitted through the command/address bus 11 at a rising edge of the clock signal CK is accurately captured by the memory device 100. Also, the chip selection signal CS indicating that the command/address signal CA is a command may have an active pulse width that is equal to or less than a general cycle of the clock signal CK, and thus, the command bus training may include training an activated chip selection signal CS.

As described above, the data bus training may check whether the data signal DQ is accurately captured in a specific rising edge of the clock signal CK, while the command bus training may be performed before the data bus training and may check whether the command/address signal CA and the chip selection signal CS are accurately captured in an unspecified rising edge of the clock signal CK. Accordingly, the command bus training may be more difficult than the data bus training. Detailed aspects with respect to the command bus training will be described as follows with reference to FIG. 2.

Figure 2:
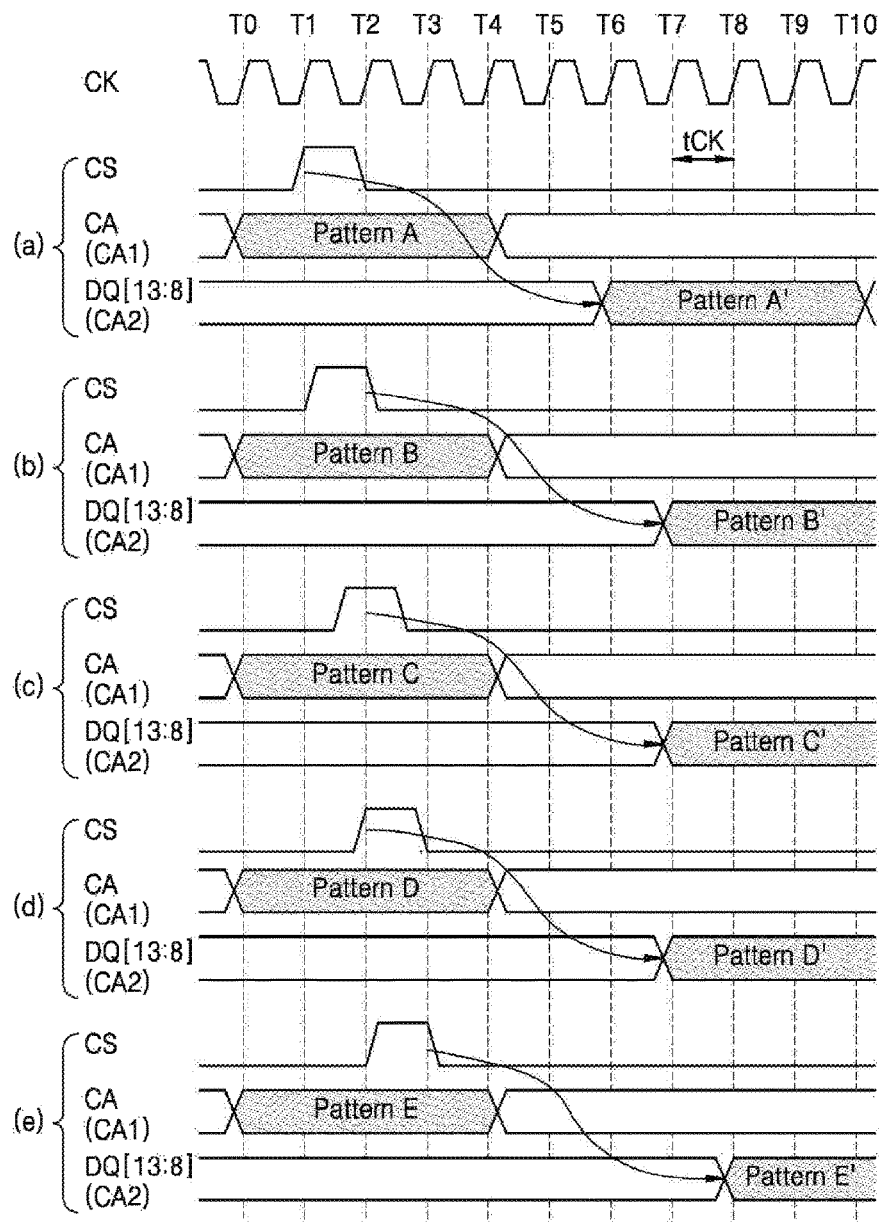
FIG. 2 is an exemplary timing diagram of signals transferred between a memory device and a memory controller during command bus training.
Figure 3:
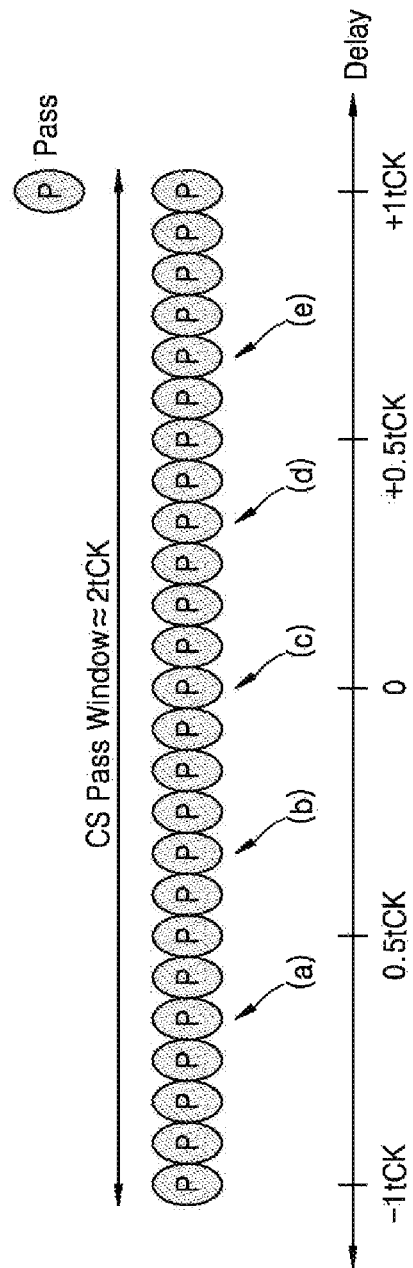
FIG. 3 is a diagram for describing an operation of determining a timing of a chip selection signal by a memory controller.

FIG. 2 is an exemplary timing diagram of signals transferred between the memory device 100 and the memory controller 200 during command bus training. FIG. 3 is a diagram for describing an operation of determining a timing of the chip selection signal CS by the memory controller 200. Hereinafter, FIGS. 2 and 3 will be described with reference to FIG. 1.

During the command bus training, the memory controller 200 may repeat an operation of transmitting the chip selection signal CS to the memory device 100 and receiving a response from the memory device 100. That is, the memory controller 200 may adjust a delay of an active pulse (e.g., high pulse) of the chip selection signal CS with respect to the clock signal CK (e.g., a rising edge or a falling edge of the clock signal CK) and determine a timing of the chip selection signal CS based on responses of the memory device 100 corresponding to a plurality of delays of the chip selection signal CS. The active pulse width of the chip selection signal CS may be equal to or less than a cycle tCK of the clock signal CK.

FIG. 2 illustrates the exemplary timing diagram of the signals transferred between the memory device 100 and the memory controller 200 in five different delays of the chip selection signal CS, based on a transmission and reception time in the memory device 100. Each of the signals may be transferred between the memory device 100 and the memory controller 200 through a different signal line, and thus, may have a different delay. Thus, even if the memory controller 200 transmits the chip selection signal CS such that a rising edge of the clock signal CK is in a middle of the active pulse of the chip selection signal CS, the rising edge of the clock signal CK may be at other points than the middle of the active pulse of the chip selections signal CS, in the memory device 100.

Referring to (a) of FIG. 2, the memory controller 200 may transmit a first command/address signal CA1 having Pattern A through the command/address bus 11, and may transmit a chip selection signal CS having a rising edge near T1.

Referring to (b) of FIG. 2, the memory controller 200 may transmit the first command/address signal CA1 having Pattern B through the command/address bus 11, and may transmit the chip selection signal CS having a falling edge near T2. Referring to (c) of FIG. 2, the memory controller 200 may transmit the first command/address signal CA1 having Pattern C through the command/address bus 11, and may transmit the chip selection signal CS, a middle of an active pulse of which is located near T2. Referring to (d) of FIG. 2, the memory controller 200 may transmit the first command/address signal CA1 having Pattern D through the command/address bus 11, and may transmit the chip selection signal CS having a rising edge near T2. Referring to (e) of FIG. 2, the memory controller 200 may transmit the first command/address signal CA1 having Pattern E through the command/address bus 11, and may transmit the chip selection signal CS having a falling edge near T3. As illustrated in FIG. 2, the first command/address signal CA1 transmitted by the memory controller 200 may maintain each of the patterns for a sufficiently long time period. Also, it is desirable that the timing of the chip selection signal CS illustrated in (c) of FIG. 2 be determined as an optimal timing of the chip selection signal CS.

The memory controller 200 may transmit the first command/address signal CA1 to the memory device 100 through the command/address bus 11 together with the chip selection signal CS of which the timing is adjusted. When the chip selection signal CS is activated at a rising edge of the clock signal CK, the memory device 100 may generate a second command/address signal CA2 by latching the first command/address signal CA1. The memory device 100 may transmit the second command/address signal CA2 to the memory controller 200, and the memory controller 200 may compare the first command/address signal CA1 and the second command/address signal CA2. For example, the command/address bus 11 may include six signal lines, and the memory device 100 may transmit the second command/address signal CA2 to the memory controller 200 through the six signal lines (for example, DQ[13:8] of DQ[15:0] illustrated in FIG. 2) of the data bus 17.

In the five cases illustrated in FIG. 2, the memory device 100 may transmit the second command/address signal CA2 generated by latching the first command/address signal CA1 at the rising edge of the clock signal CK to the memory controller 200 through some signal lines of the data bus 17. As illustrated in FIG. 2, in the five cases, the second command/address signal CA2 may have Pattern A', Pattern B', Pattern C', Pattern D', and Pattern E', respectively. As illustrated in FIG. 2, the second command/address signal CA2 transmitted from the memory device 100 may maintain each of the patterns for a sufficiently long time period.

When the first command/address signal CA1 and the second command/address signal CA2 correspond to each other, the memory controller 200 may determine the timing in which the chip selection signal CS is transmitted as pass. When the first command/address signal CA1 and the second command/address signal CA2 do not correspond to each other, the memory controller 200 may determine the timing in which the chip selection signal CS is transmitted as fail. The memory controller 200 may determine an optimal timing of the chip selection signal CS based on a plurality of comparison results.

FIG. 3 illustrates a plurality of comparison results corresponding to a plurality of different delays of the chip selection signal CS, when a delay of the chip selection signal CS illustrated in (c) of FIG. 2 is assumed to be 0. For example, in (a) of FIG. 2, an active pulse of the chip selection signal CS may be sampled at a rising edge of the clock signal CK at T1, and the memory device 100 may transmit the second command/address signal CA2 having Pattern A' to the memory controller 200 by latching the first command/address signal CA1 having Pattern A. Since the active pulse of the chip selection signal CS is sampled at T1, the memory device 100 may transmit the second command/address signal CA2 having Pattern A' identical to Pattern A of the first command address signal CA1 to the memory controller 200, and as illustrated in (a) of FIG. 3, the memory controller 200 may determine the timing of the chip selection signal CS illustrated in (a) of FIG. 2 as pass.

Active pulses of the chip selection signal CS illustrated in (b) through (d) of FIG. 2 may be sampled at a rising edge of the clock signal CK at T2. Accordingly, Pattern B, Pattern C, and Pattern D of the first command/address signal CA1 may respectively be identical to Pattern B', Pattern C', and Pattern D' of the second command/address signal CA2. As illustrated in (b) through (d) of FIG. 3, the memory controller 200 may determine all of the timings of the chip selection signal CS illustrated in (b) through (d) of FIG. 2 as pass.

An active pulse of the chip selection signal CS illustrated in (e) of FIG. 2 may be sampled at a rising edge of the clock signal CK at T3. Accordingly, Pattern D of the first command/address signal CA1 may be identical to Pattern D' of the second command/address signal CA2. As illustrated in (e) of FIG. 3, the memory controller 200 may determine the timing of the chip selection signal CS illustrated in (e) of FIG. 2 as pass.

As illustrated in FIG. 3, with respect to the chip selection signal CS having an active pulse width that is equal to or less than 1 tCK, a pass window (e.g., CS pass window) that is equal to 2 tCK or greater than 1 tCK may be measured. That is, even if at least one of the active pulses of the chip selection signal CS illustrated in (a) and (e) of FIG. 2 have to be determined as fail, all of the active pulses of the chip selection signal CS illustrated in (a) and (e) of FIG. 2 may be determined as pass, due to the rising edges of the clock signal CK at T1 and T3, which are adjacent to T2. Accordingly, the memory controller 200 may not determine an optimal timing (e.g., (c) of FIG. 2) of the active pulse of the chip selection signal CS illustrated in (c) of FIG. 2.

As described hereinafter, a memory device according to example embodiments may generate an internal clock signal by dividing a received clock signal CK, and may sample a chip selection signal CS by using the internal clock signal, in order to improve the accuracy of the command bus training. A memory controller may change the internal clock signal (e.g. a phase of the internal clock signal) generated by the memory device, and may perform command bus training according to the changed internal clock signal. Also, training with respect to the command/address bus 11 may be omitted due to the chip selection line 13, which is accurately trained, and thus, the time consumed by the command bus training may be reduced.

Figure 4:
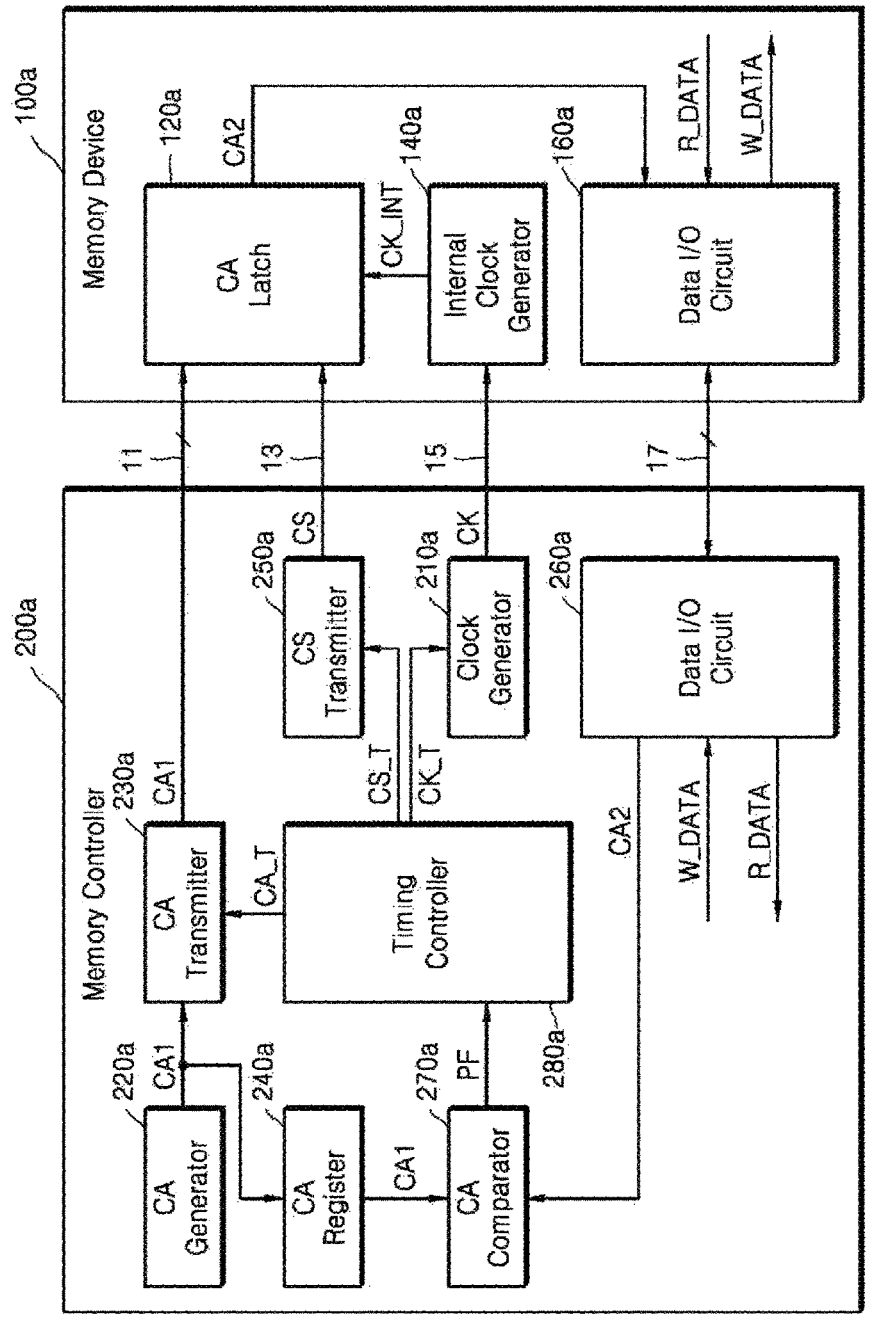
FIG. 4 is a block diagram of a system including a memory device and a memory controller according to exemplary embodiments.

FIG. 4 is a block diagram of a system 1000a including a memory device 100a and a memory controller 200a according to example embodiments. As illustrated in FIG. 4, the memory device 100a and the memory controller 200a may communicate with each other through the command/address bus 11, the chip selection line 13, the clock line 15, and the data bus 17.

Referring to FIG. 4, the memory device 100a may include a command/address latch 120a, an internal clock generator 140a, and a data input/output circuit 160a. Components included in the memory device 100a are separately illustrated in FIG. 4, for convenience of explanation. For example, at least two of the components may be realized as one component.

The internal clock generator 140a may receive a clock signal CK from the memory controller 200a through the clock line 15, and may generate an internal clock signal CK_INT by dividing the clock signal CK. For example, a frequency of the internal clock signal CK_INT may be, for example, ½ or ¼ of a frequency of the clock signal CK. For example, a frequency of the clock signal CK may be 1 GHz and a frequency of the internal clock signal CK_INT may be 500 MHz or 250 MHz.

In example embodiments, the internal clock generator 140a may receive a clock signal CK from the memory controller 200a through the clock line 15, and may generate a plurality of internal clock signals CK_INT by dividing the clock signal CK. For example, each of the plurality of internal clock signals CK_INT may have the same frequency (e.g., 1 GHz) by dividing the clock signal CK (e.g., 2 GHz, 4 GHz, etc.), and may have a different phase with respect to each other (e.g., 90°, 180°, 270°, etc.).

In example embodiments, the memory controller 200a may generate and transmit a first clock signal CK1 and a second clock signal CK2 having ½ or ¼ frequency of the first clock signal CK1 through the clock line 15. In that case, the clock line 15 may include a plurality of clock lines.

The command/address latch 120a may receive a first command/address signal CA1 from the memory controller 200a through the command/address bus 11, and may receive a chip selection signal CS from the memory controller 200a through the chip selection line 13. Also, the command/address latch 120a may receive the internal clock signal CK_INT from the internal clock generator 140a, and may output a second command/address signal CA2 by latching the first command/address signal CA1 when the chip selection signal CS is activated at a rising edge of the internal clock signal CK_INT.

The data input/output circuit 160a may receive write data W_DATA from the memory controller 200a through the data bus 17, and may output the write data W_DATA (e.g., to a memory cell array). Also, the data input/output circuit 160a may receive read data R_DATA (e.g., from the memory cell array) and may transmit the read data R_DATA to the memory controller 200a through the data bus 17. During a command bus training mode, the data input/output circuit 160a may transmit the second command/address signal CA2 received from the command/address latch 120a to the memory controller 200a through some signal lines of the data bus 17.

Although it is not illustrated in FIG. 4, the memory device 100a may include a control logic unit (not shown) (as used herein, a "unit" may refer to a "circuit"), and during the command bus training mode, the control logic unit may enable the command/address latch 120a, the internal clock generator 140a, and the data input/output circuit 160a or control the command/address latch 120a, the internal clock generator 140a, and the data input/output circuit 160a to perform specific operations.

As illustrated in FIG. 4, since the internal clock signal CK_INT generated by dividing the clock signal CK transmitted to the memory device 100a from the memory controller 200a is used to sample the chip selection signal CS, problems illustrated in FIGS. 2 and 3 may be solved. Detailed aspects with respect to the operation of the memory device 100a will be described later with reference to FIGS. 5 and 6.

Referring to FIG. 4, the memory controller 200a may include a clock generator 210a, a command/address generator 220a, a command/address transmitter 230a, a command/address register 240a, a chip selection transmitter 250a, a data input/output circuit 260a, a command/address comparator 270a, and a timing controller 280a. Components included in the memory controller 200a are separately illustrated in FIG. 4, for convenience of explanation. For example, at least two of the components may be realized as one component.

The clock generator 210a may receive a clock control signal CK_T from the timing controller 280a. The clock generator 210a may adjust a timing, for example, a frequency, of the clock signal CK transmitted through the clock line 15 in response to the clock control signal CK_T.

The command/address generator 220a may generate the first command/address signal CA1. For example, the command/address generator 220a may generate the first command/address signal CA1 having a specific pattern. The command/address transmitter 230a may receive the first command/address signal CA1 from the command/address generator 220a, and may receive a command/address control signal CA_T from the timing controller 280a. The command/address transmitter 230a may adjust a timing of the first command/address signal CA1 transmitted through the command/address bus 11 in response to the command/address control signal CA_T.

The command/address register 240a may receive and store the first command/address signal CA1 generated by the command/address generator 220a. FIG. 4 illustrates the example in which the command/address register 240a receives the first command/address signal CA1 from the command/address generator 220a. In example embodiments, the command/address register 240a may receive and store the first command/address signal CA1 output by the command/address transmitter 230a.

The chip selection transmitter 250a may receive a chip selection control signal CS_T from the timing controller 280a, and may adjust a timing of the chip selection signal CS transmitted through the chip selection line 13, for example, a delay of an active pulse (e.g., pulse remaining a high level) of the chip selection signal CS, in response to the chip selection control signal CS_T.

The data input/output circuit 260a may receive read data R_DATA from the memory device 100a (e.g., a memory cell array) through the data bus 17, and may output the read data R_DATA. Also, the data input/output circuit 260a may receive write data W_DATA, and may transmit the write data W_DATA to the memory device 100a through the data bus 17. During the command bus training mode, the data input/output circuit 260a may transmit the second command/address signal CA2 received from the memory device 100a to the command/address comparator 270a through some signal lines of the data bus 17.

The command/address comparator 270a may compare the first command/address signal CA1 stored in the command/address register 240a with the second command/address signal CA2 received from the memory device 100a through the data input/output circuit 260a. The command/address comparator 270a may output a pass/fail signal PF according to a result of comparing the first command/address signal CA1 with the second command/address signal CA2.

The timing controller 280a may control a timing of each of signals transmitted to the memory device 100a. As described above, the timing controller 280a may control the timing of the clock signal CK, the first command/address signal CA1, and the chip selection signal CS by outputting the clock control signal CK_T, the command/address control signal CA_T, and the chip selection control signal CS_T, respectively. Also, the timing controller 280a may receive the pass/fail signal PF from the command/address comparator 270a, may determine the timing of the chip selection signal CS based on the pass/fail signals PF corresponding to a plurality of different timings of the chip selection signal CS, and may determine a timing of the first command/address signal CA1 based on the pass/fail signals PF corresponding to a plurality of different timings of the first command/address signal CA1.

Figure 5:
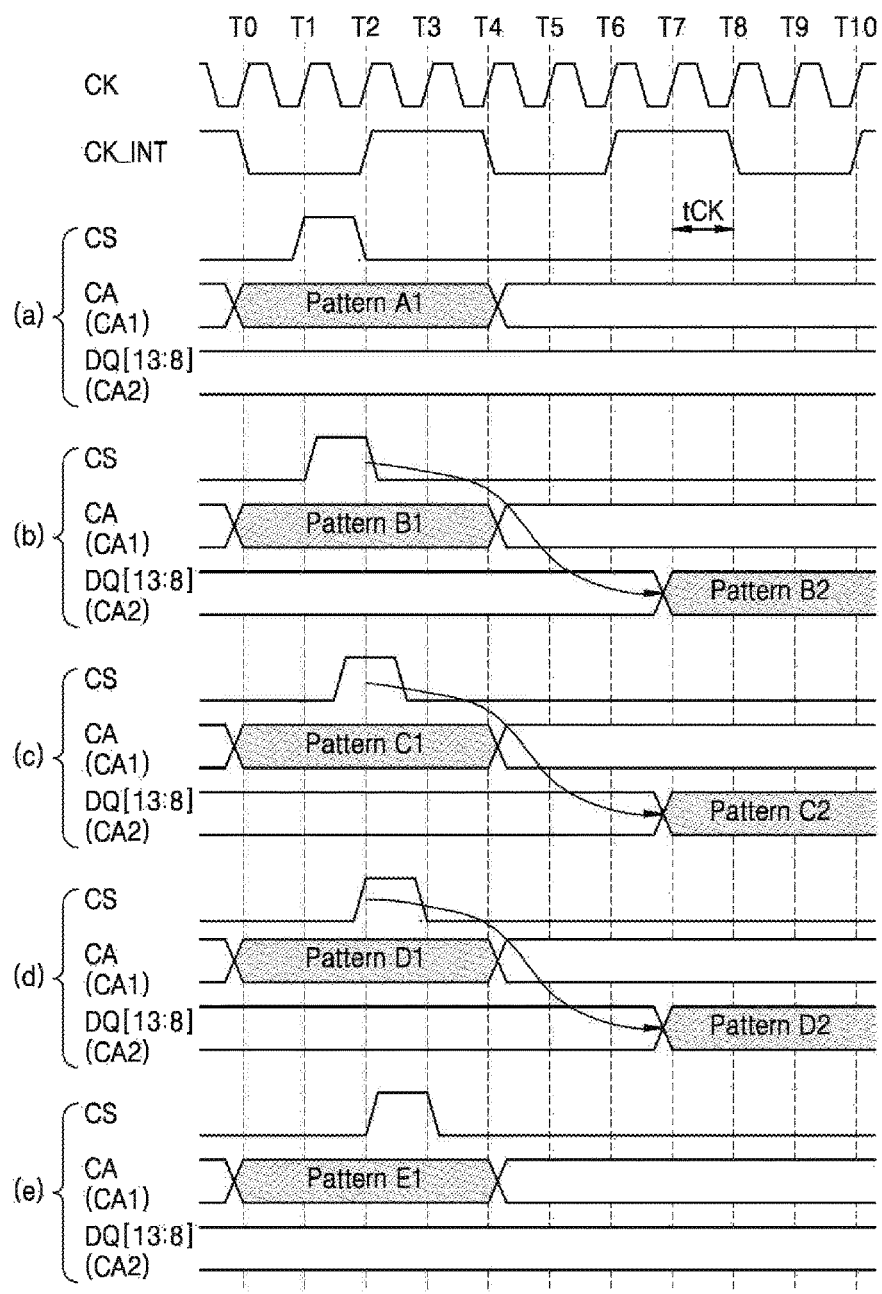
FIG. 5 is an exemplary timing diagram of signals transferred between the memory device and the memory controller of FIG. 4 during command bus training according to example embodiments.
Figure 6:
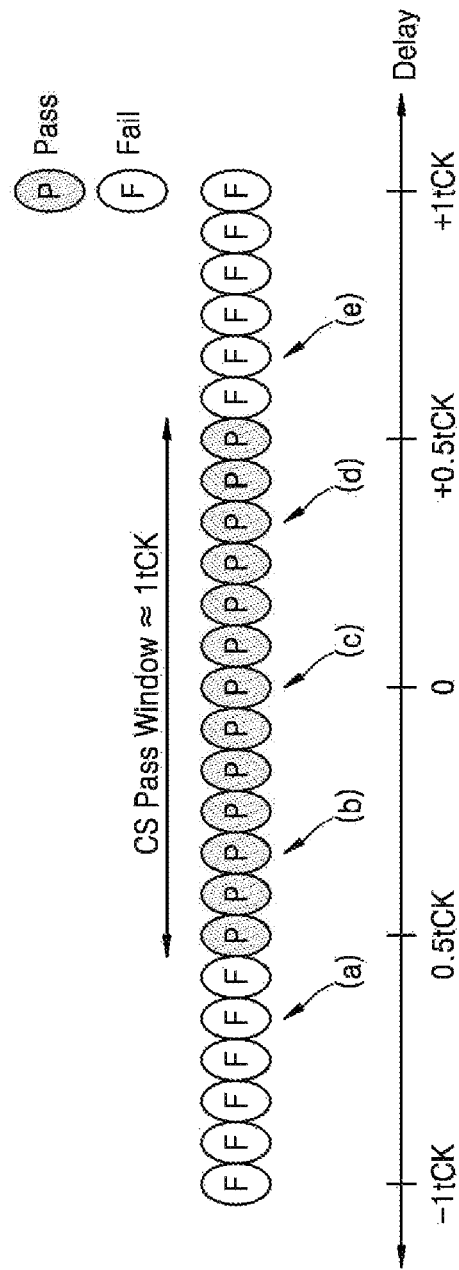
FIG. 6 is a diagram for describing an operation of determining a timing of a chip selection signal by a memory controller according to example embodiments.

FIG. 5 is an exemplary timing diagram of signals transferred between the memory device 100a and the memory controller 200a of FIG. 4, during a command bus training operation. FIG. 6 is a diagram for describing an operation of determining a timing of the chip selection signal CS by the memory controller 200a. Hereinafter, FIGS. 5 and 6 will be described with reference to FIG. 4.

Referring to FIG. 5, the internal clock generator 140a of the memory device 100a illustrated in FIGS. 5 and 6 may generate an internal clock signal CK_INT having a frequency that is ¼ of a frequency of the clock signal CK. Active pulses of the chip selection signal CS illustrated in (a) through (e) of FIG. 5 may have the same delays as the active pulses of the chip selection signal CS illustrated in (a) through (e) of FIG. 2, respectively. For example, the clock signal CK has 4 clock cycles (i.e., 4 tCK) during one clock cycle (i.e., 1 tCK) of the internal clock signal CK_INT. Thus, a frequency of the clock signal CK may be 4 times of a frequency of the internal clock signal CK_INT. As illustrated in FIG. 5, only the active pulses of the chip selection signal CS illustrated in (b) through (d) of FIG. 5 may be sampled due to a rising edge of the internal clock signal CK_INT at T2. Accordingly, patterns of the second command/address signal CA2 transmitted from the memory device 100a, for example, Pattern B2, Pattern C2, and Pattern D2 may be identical to Pattern B1, Pattern C1, and Pattern D1 of the first command/address signal CA1, respectively. On the contrary, the active pulses of the chip selection signal CS illustrated in (a) and (e) of FIG. 5 may not be sampled due to the rising edge of the internal clock signal CK_INT at T2. Accordingly, the memory device 100a may transmit the second command/address signal CA2 maintaining a previous pattern or having a default pattern, and the pattern of the second command/address signal CA2 may be different from the patterns of the first command/address signal CA1, that is, Pattern A1 and Pattern E1.

In example embodiments, each of the Patterns A1-E1 may include a command signal (e.g., active, precharge, refresh, read, write, etc.) or an address signal based on the chip selection signal CS. For example, the first command/address signal CA1 may include control signals (e.g., WE, RAS, CAS, etc.) or a plurality of address signals.

In example embodiments, instead of the chip selection signal CS illustrated in (a) through (e) of FIG. 5, each of the control signals and address signals of the first command/address signal CA1 having adjustable delays with respect to the internal clock signal CK_INT may be input. In this case, it is assumed that the chip selection signal CS has a sufficient margin that does not affect to the training mode operation when the first command/address signal CA1 latches.

As illustrated in FIG. 6, due to the internal clock signal CK_INT divided from the clock signal CK, a pass window (e.g., CS pass window) of about 1 tCK may be measured with respect to the chip selection signal CS having an active pulse width of about 1 tCK. Accordingly, the memory controller 200a (that is, the timing controller 280a of the memory controller 200a) may determine a timing of the active pulse of the chip selection signal CS corresponding to a median portion (c) of the pass window, as the timing of the chip selection signal CS. In example embodiments, when the first command/address signal CA1 having adjustable delays input, the memory controller 200a may determine a timing of the first command/address signal CA1 corresponding to a median portion (c) of a pass window (e.g., first command/address signal CA1 pass window), as the timing of the first command/address signal CA1.

Figure 7:
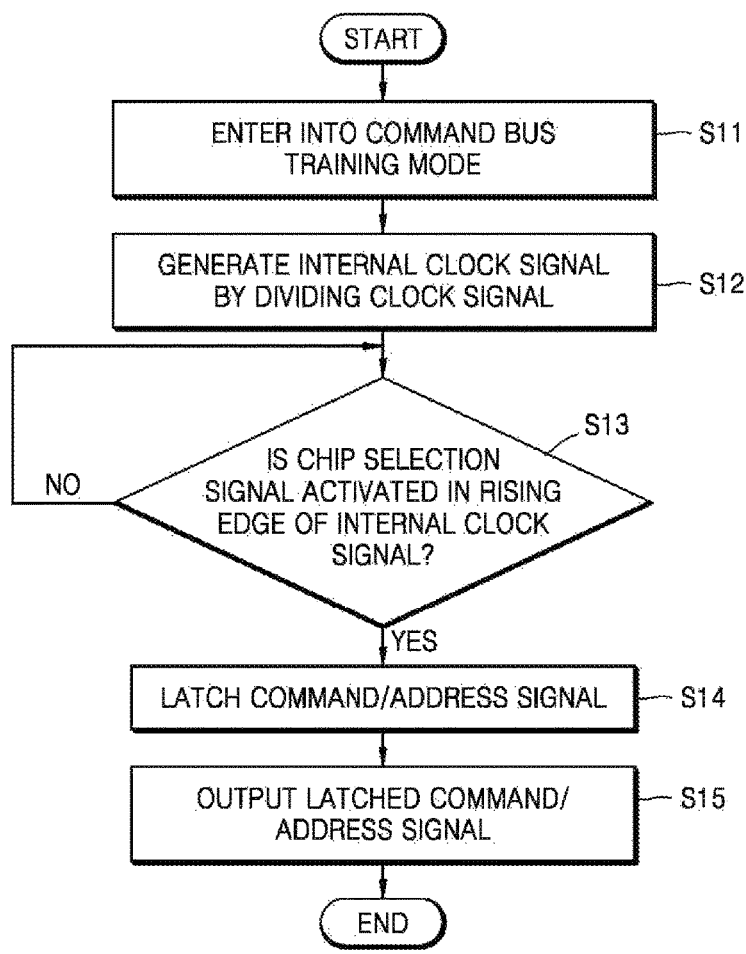
FIG. 7 is a flowchart of an operating method of the memory device of FIG. 4, according to exemplary embodiments.

FIG. 7 is a flowchart of an operating method of the memory device 100a of FIG. 4, according to example embodiments. As illustrated in FIG. 7, the operating method of the memory device 100a may include operations S11 through S15.

In operation S11, an operation of entering into a command bus training mode may be performed. For example, the memory controller 200a may transmit a command for entering into the command bus training mode to the memory device 100a, and the memory device 100a may enter into the command bus training mode in response to the received command.

In operation S12, an operation of generating the internal clock signal CK_INT by dividing the clock signal CK may be performed. For example, the internal clock generator 140a of the memory device 100a may generate the internal clock signal CK_INT having a frequency, for example, ½ or ¼ of a frequency of the clock signal CK by dividing the clock signal CK.

In operation S13, an operation of determining whether the chip selection signal CS is activated or not at the rising edge (or the falling edge) of the internal clock signal CK_INT may be performed. When the chip selection signal CS is activated at the rising edge of the internal clock signal CK_INT, an operation of latching a command/address signal may be performed in operation S14. For example, the command/address latch 120a of the memory device 100a may receive the chip selection signal CS, the first command/address signal CA1, and the internal clock signal CK_INT, and when the chip selection signal CS is activated at the rising edge of the internal clock signal CK_INT, the command/address latch 120a of the memory device 100a may latch the first command/address signal CA1 to generate the second command/address signal CA2.

In operation S15, an operation of outputting the latched command/address signal may be performed. For example, the data input/output circuit 160a of the memory device 100a may receive the second command/address signal CA2 from the command/address latch 120a, and may transmit the second command/address signal CA2 to the memory controller 200a through some signal lines of the data bus 17.

Figure 8A:
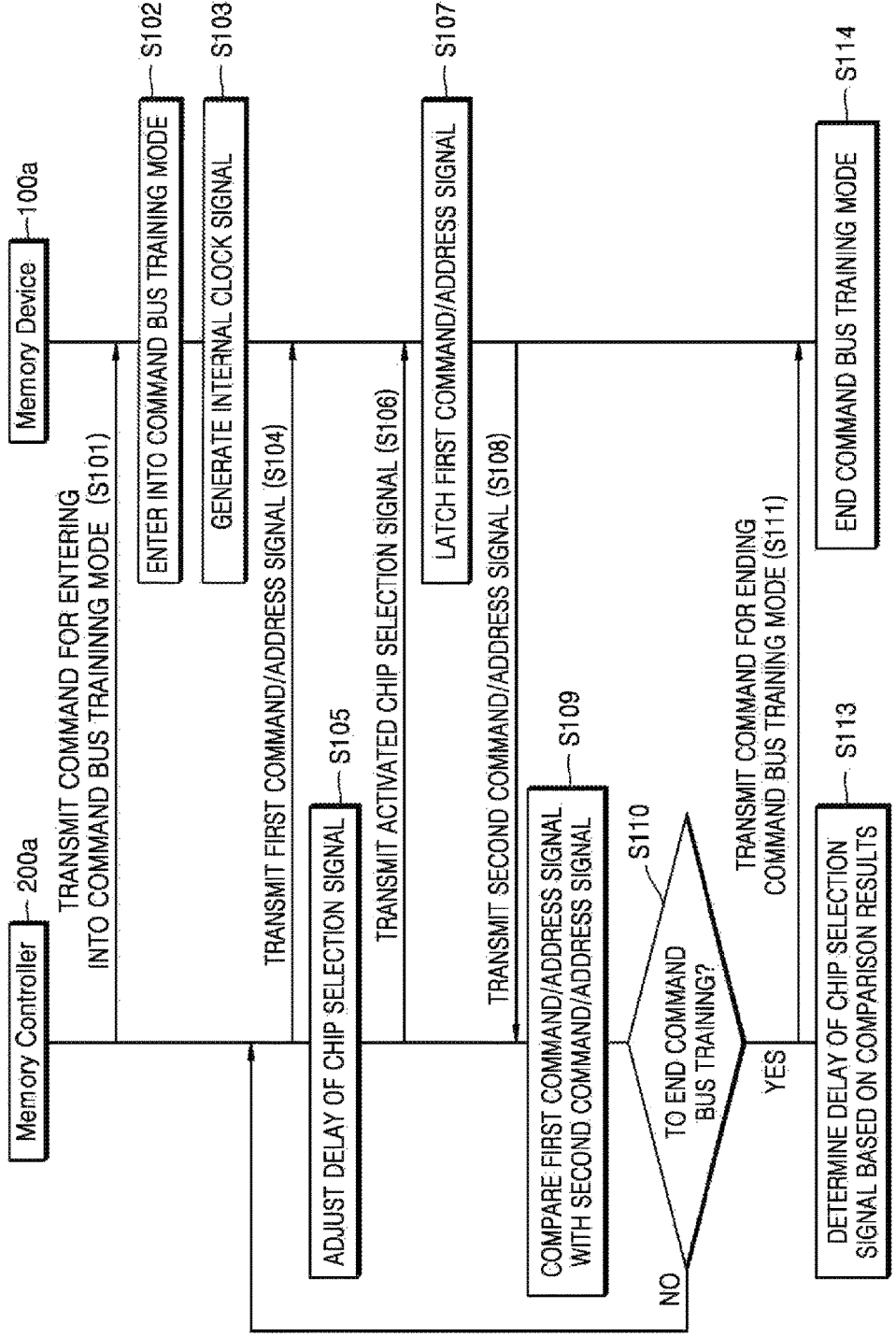
FIG. 8A is a diagram for describing an operation between the memory device and the memory controller of FIG. 4 according to the passage of time, according to exemplary embodiments.

FIG. 8A is a diagram for describing an operation between the memory device 100a and the memory controller 200a of FIG. 4 according to the passage of time, according to example embodiments.

The memory controller 200a may transmit the command for entering into the command bus training mode in operation S101. The memory device 100a may enter into the command bus training mode in response to the received command in operation S102. The memory device 100a may generate the internal clock signal CK_INT by dividing the clock signal CK received from the memory controller 200a, in operation S103.

The memory controller 200a may transmit the first command/address signal CA1 in operation S104. For example, the memory controller 200a may transmit the first command/address signal CA1 having a specific pattern (e.g., active, precharge, refresh, read, write, etc.). Then, the memory controller 200a may adjust a delay of the chip selection signal CS in operation S105. For example, the memory controller 200a may adjust a delay of an active pulse of the chip selection signal CS to gradually increase or decrease. The memory controller 200a may transmit the activated chip selection signal CS in operation S106. For example, the memory controller 200a may transmit the active pulse of the chip selection signal CS according to the adjusted delay.

When the activated chip selection signal CS is sampled at a rising edge (or, falling edge) of the internal clock signal CK_INT, the memory device 100a may latch the first command/address signal CA1 in operation S107. The memory device 100a may generate the second command/address signal CA2 by latching the first command/address signal CA1, and may transmit the second command/address signal CA2 to the memory controller 200a in operation S108.

The memory controller 200a may compare the first command/address signal CA1 with the second command/address signal CA2 in operation S109, and may accumulate results of the comparison. The memory controller 200a may determine whether to end the command bus training in operation S110. For example, the memory controller 200a may determine whether the delay of the chip selection signal CS is adjusted to a maximum value (or a minimum value) which is adjustable. Alternatively, the memory controller 200a may determine whether the delay of the chip selection signal CS may be determined based on the accumulated results of the comparison. When the command bus training is not ended, the memory controller 200a may repeat to transmit the first command/address signal in operation S104. In addition, the first command/address signal CA1 may have a different pattern from the previous first command/address signal CA1. On the other hand, when the command bus training is ended, the memory controller 200a may transmit a command for ending the command bus training mode to the memory device 100a in operation S111. The memory device 100a may end the command bus training mode in response to the received command in operation S114.

The memory controller 200a may determine the delay of the chip selection signal CS based on the accumulated results of the comparison in operation S113. For example, as illustrated in FIG. 6, the memory controller 200a may select the delay of the chip selection signal CS corresponding to a median of the CS pass window (e.g., (c) of FIG. 6).

Figure 8B:
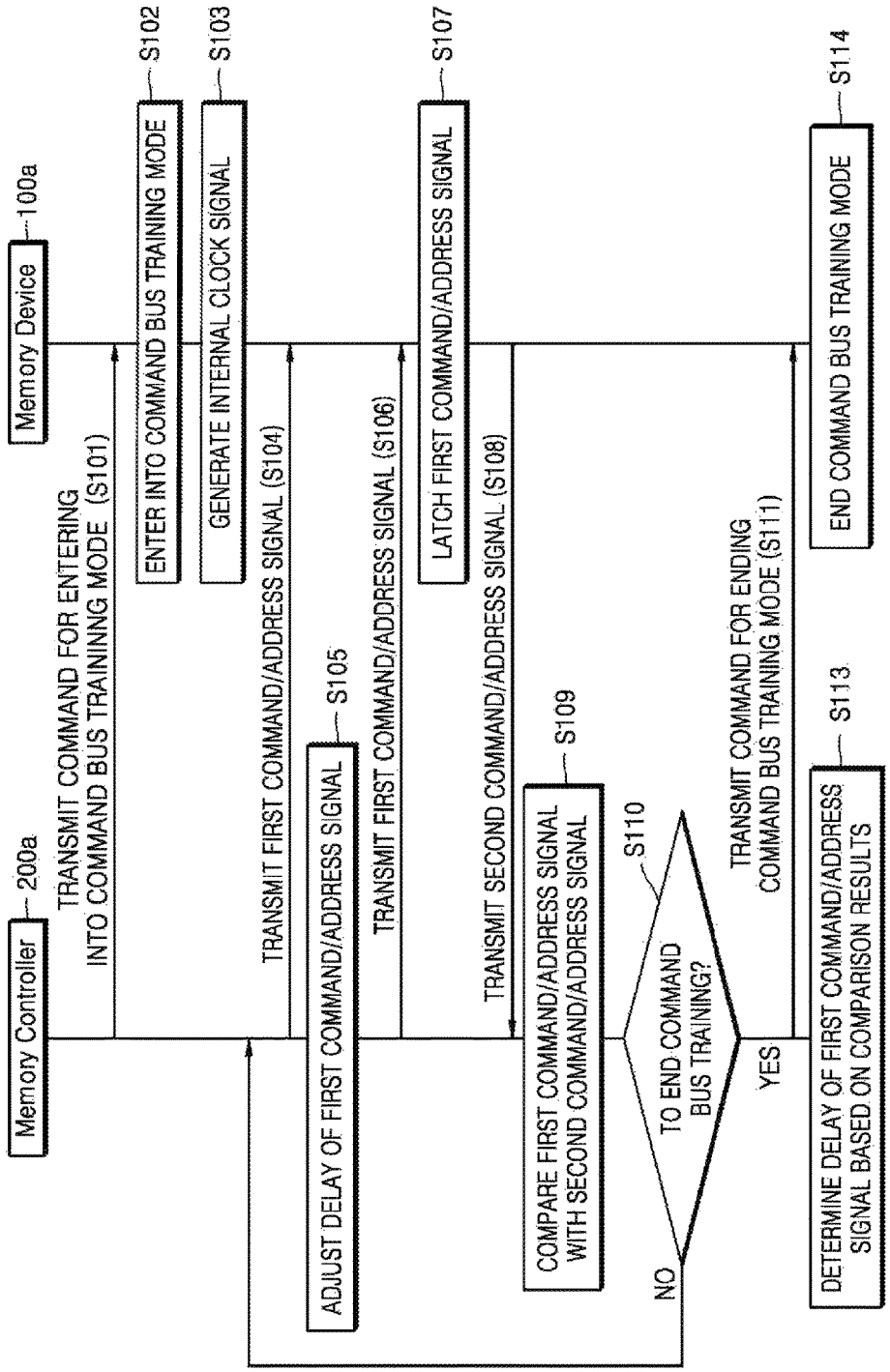
FIG. 8B is a diagram for describing an operation between the memory device 100a and the memory controller 200a of FIG. 4 according to example embodiments.

FIG. 8B is a diagram for describing an operation between the memory device 100a and the memory controller 200a of FIG. 4, according to example embodiments. Hereinafter, aspects that are the same or substantially the same as the aspects described the diagram of FIG. 8A may not be described.

The memory controller 200a may transmit the command for entering into the command bus training mode in operation S101. The memory device 100a may enter into the command bus training mode in response to the received command in operation S102. The memory device 100a may generate the internal clock signal CK_INT by dividing the clock signal CK received from the memory controller 200a, in operation S103.

The memory controller 200a may transmit the first command/address signal CA1 in operation S104. For example, the memory controller 200a may transmit the first command/address signal CA1 having a specific pattern (e.g., active, precharge, refresh, read, write, etc.). Then, the memory controller 200a may adjust a delay of the first command/address signal CA1 in operation S105. For example, the memory controller 200a may adjust a delay of the first command/address signal CA1 to gradually increase or decrease. In example embodiments, one or more signals of the first command/address signal CA1 may be adjusted by the delay in operation S105. The memory controller 200a may transmit the first command/address signal CA1 in operation S106. For example, the memory controller 200a may transmit the first command/address signal CA1 according to the adjusted delay.

When the first command/address signal CA1 is sampled at the rising edge (or the falling edge) of the internal clock signal CK_INT, the memory device 100a may latch the first command/address signal CA1 in operation S107. It is assumed that the chip selection signal CS has a sufficient margin that does not affect to the training mode operation in operation S107. The memory device 100a may generate the second command/address signal CA2 by latching the first command/address signal CA1, and may transmit the second command/address signal CA2 to the memory controller 200a in operation S108.

The memory controller 200a may compare the first command/address signal CA1 with the second command/address signal CA2 in operation S109, and may accumulate results of the comparison. The memory controller 200a may determine whether to end the command bus training in operation S110. For example, the memory controller 200a may determine whether the delay of the first command/address signal CA1 is adjusted to a maximum value (or a minimum value) which is adjustable. Alternatively, the memory controller 200a may determine whether the delay of the first command/address signal CA1 may be determined based on the accumulated results of the comparison. When the command bus training is not ended, the memory controller 200a may repeat to transmit the first command/address signal in operation S104. In addition, the first command/address signal CA1 may have a different pattern from the previous pattern of the first command/address signal CA1. On the other hand, when the command bus training is complete, the memory controller 200a may transmit a command for ending the command bus training mode to the memory device 100a in operation S111. The memory device 100a may end the command bus training mode in response to the received command in operation S114.

The memory controller 200a may determine the delay of the first command/address signal CA1 based on the accumulated results of the comparison in operation S113. For example, as illustrated in FIG. 6, the memory controller 200a may select the delay of the first command/address signal CA1 corresponding to a median of the first command/address signal CA1 pass window (e.g., (c) of FIG. 6).

Figure 9A:
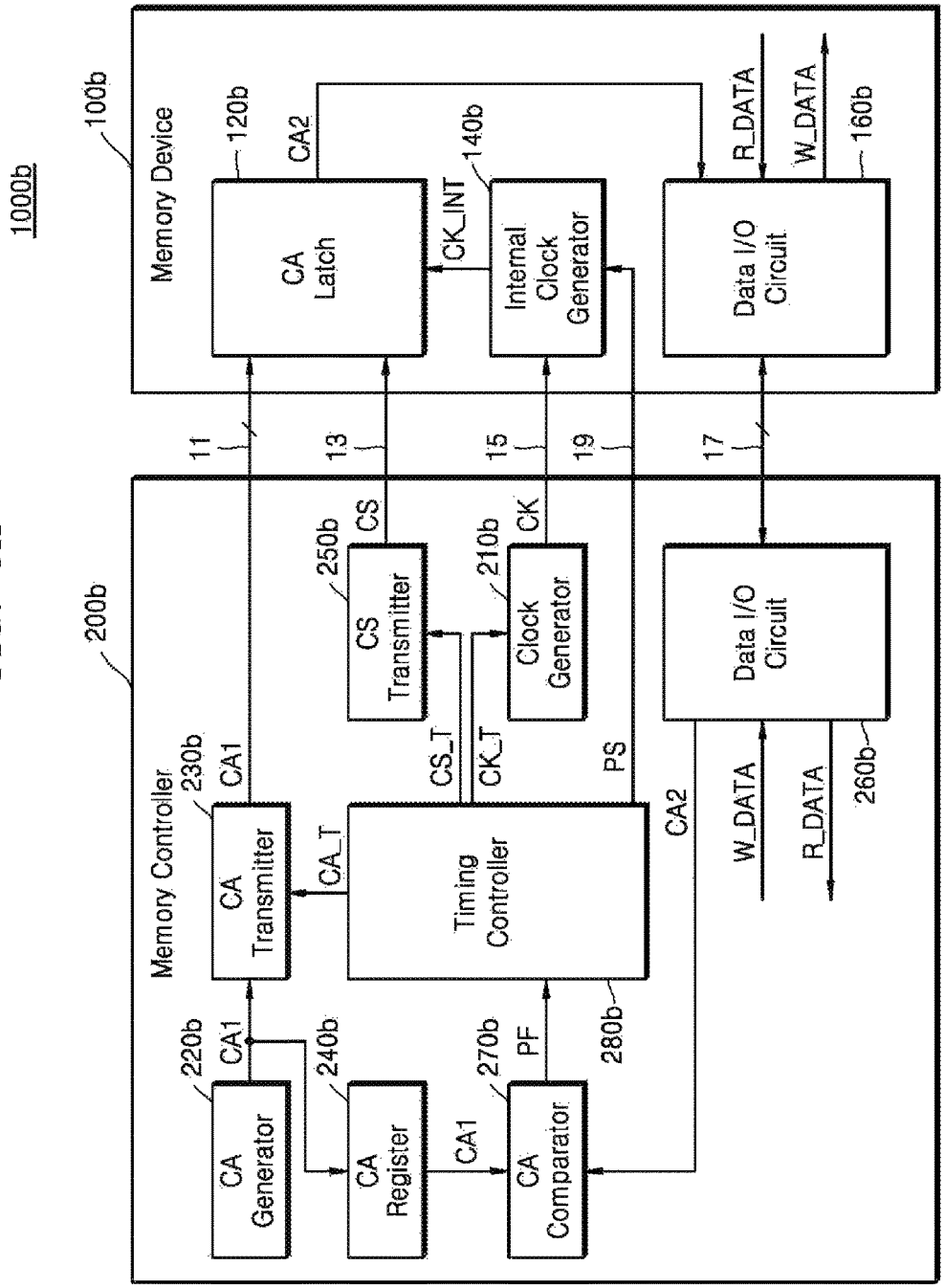
FIGS. 9A and 9B are block diagrams of systems including a memory device and a memory controller, according to exemplary embodiments.
Figure 9B:
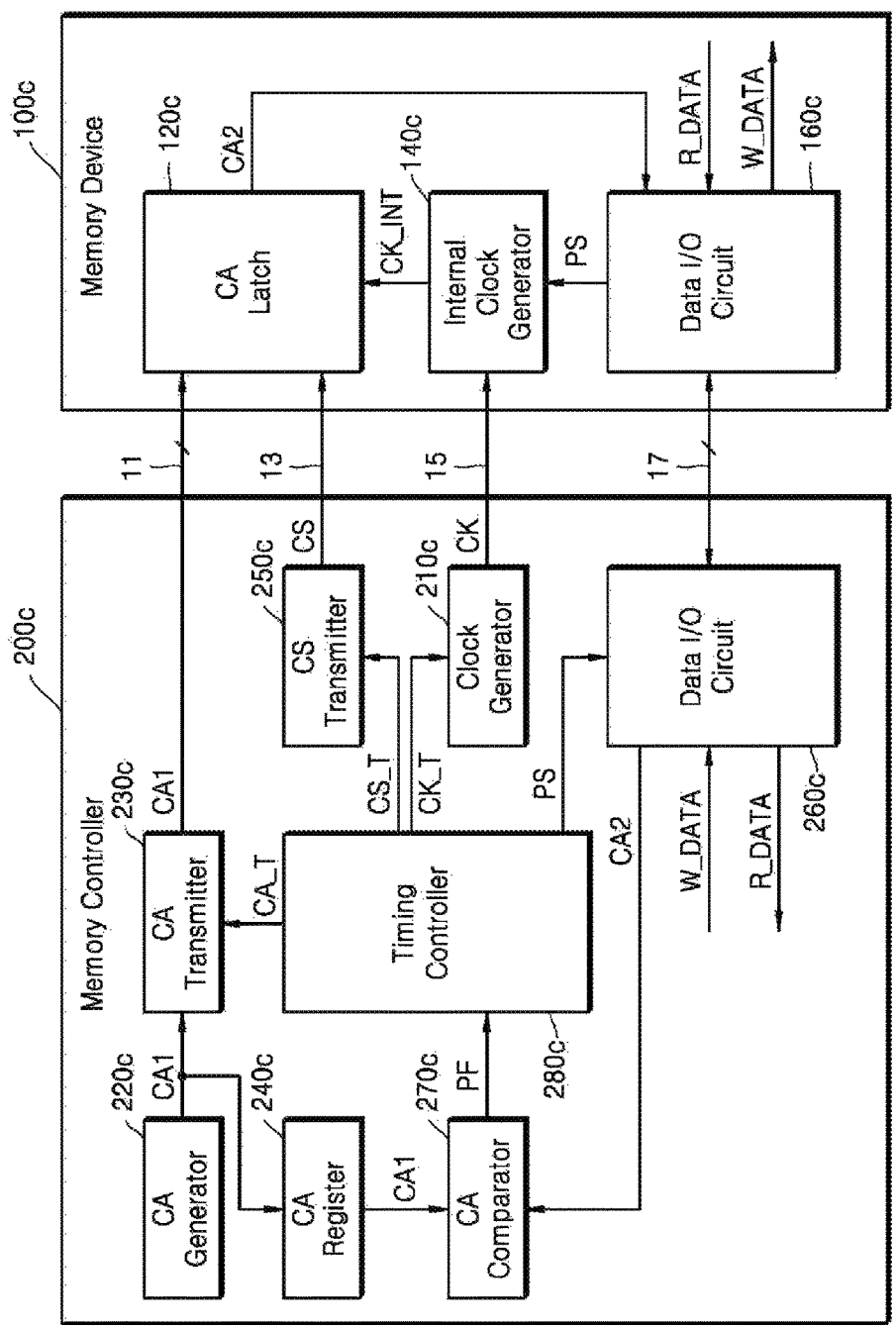

FIGS. 9A and 9B are block diagrams of examples of systems 1000b and 1000c including memory devices 100b and 100c and memory controllers 200b and 200c according to exemplary embodiments. The memory controllers 200b and 200c in the systems 1000b and 1000c illustrated in FIGS. 9A and 9B may transmit a phase selection signal PS to the memory devices 100b and 100c, respectively, through a phase selection line 19. Hereinafter, aspects that are the same or substantially the same as the aspects described for the system 1000a of FIG. 4 may not be described.

Referring to FIG. 9A, the memory device 100b may include a command/address latch 120b, an internal clock generator 140b, and a data input/output circuit 160b. The internal clock generator 140b may receive phase selection signal PS from the memory controller 200b. The internal clock generator 140b may generate a plurality of internal clock signals having different phases with respect to each other, and may select one CK_INT of the plurality of internal clock signals in response to the phase selection signal PS and output the selected internal clock signal CK_INT.

Referring to FIG. 9A, the memory controller 200b may include a clock generator 210b, a command/address generator 220b, a command/address transmitter 230b, a command/address register 240b, a chip selection transmitter 250b, a data input/output circuit 260b, a command/address comparator 270b, and a timing controller 280b. The timing controller 280b may generate the phase selection signal PS and transmit the phase selection signal PS to the memory device 100b through the phase selection line 19. The phase selection line 19 may include one or more signal lines connected to an input pin of the memory device 100b and an output pin of the memory controller 200b, which are not used during the command bus training. For example, the phase selection line 19 may be a signal line connected to a data mask pin (or a pad) of the memory device 100b and the memory controller 200b.

Referring to FIG. 9B, the memory device 100c may include a command/address latch 120c, an internal clock generator 140c, and a data input/output circuit 160c. The data input/output circuit 160c may receive a phase selection signal PS through at least one signal line of the data bus 17, during the command bus training mode. For example, the data bus 17 including a plurality of signal lines may include at least one signal line through which the second command/address signal CA2 output from the memory device 100c is transferred and at least one signal line through which the phase selection signal PS output from the memory controller 200c is transferred.

The internal clock generator 140c may receive the phase selection signal PS from the memory controller 200c. The internal clock generator 140c may generate a plurality of internal clock signals having different phases with respect to each other and may select one CK_INT of the plurality of internal clock signals in response to the phase selection signal PS and output the selected internal clock signal CK_INT. In example embodiments, each of the plurality of internal clock signals may have the same frequency, for example, 1 GHz, 2 GHz, etc.

According to an exemplary embodiment, the phase selection signal PS may be transmitted to the memory device 100b or 100c from the memory controller 200b or 200c by setting a mode register set of the memory device 100b or 100c, unlike the exemplary embodiments illustrated in FIGS. 9A and 9B. For example, the memory controller 200b or 200c may transmit a command for setting the mode register set to the memory device 100b or 100c, and the memory device 100b or 100c may change the phase selection signal PS that is input to the internal clock generator 140b or 140c in response to the received command.

In example embodiments illustrated in FIGS. 9A and 9B, each of the plurality of internal clock signals CK_INT may have the same frequency (e.g., 1 GHz) by dividing the clock signal CK (e.g., 2 GHz, 4 GHz, etc.), and may have a different phase with respect to each other (e.g., 90°, 180°, 270°, etc.).

Figure 10:
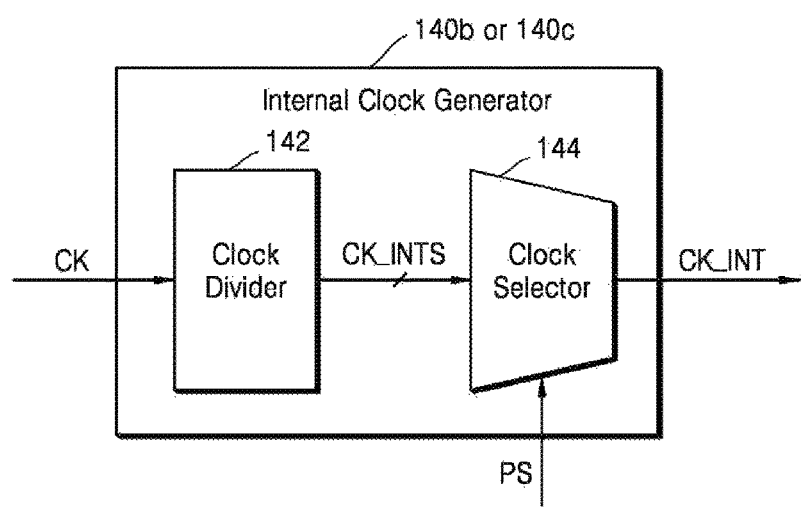
FIG. 10 is a block diagram of an example of an internal clock generator according to exemplary embodiments.
Figure 1I:
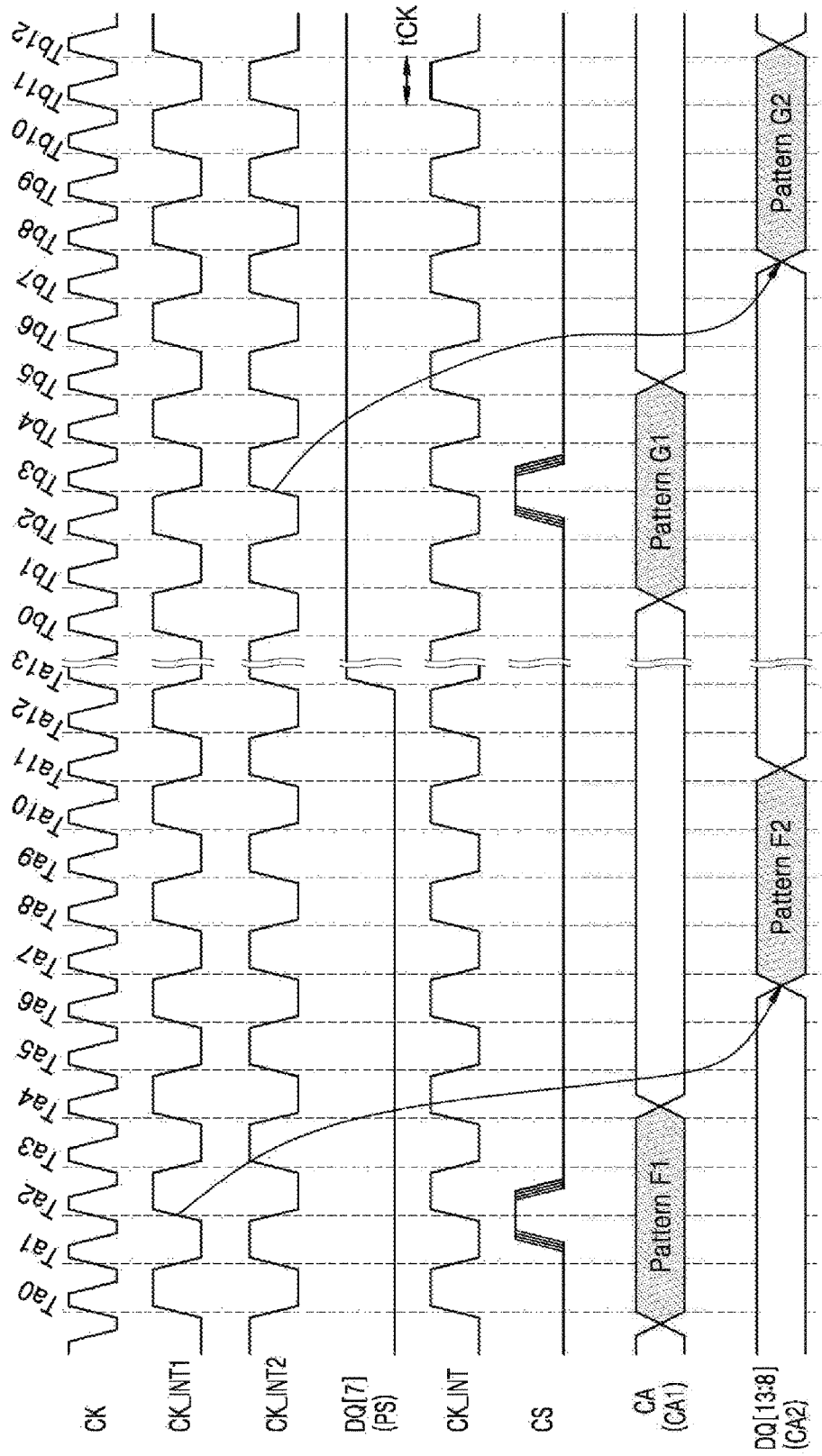

FIG. 10 is a block diagram of an example of an internal clock generator according to an exemplary embodiment. For example, FIG. 10 illustrates the internal clock generator 140b or 140c of FIG. 9A or 9B. As described above with reference to FIGS. 9A and 9B, the internal clock generator 140b or 140c may receive a clock signal CK from the memory controller 200b or 200c, and may receive a phase selection signal PS from the memory controller 200b or the data input/output circuit 160c.

Referring to FIG. 10, the internal clock generator 140b or 140c may include a clock divider 142 and a clock selector 144. The clock divider 142 may generate a plurality of internal clock signals CK_INTS by dividing the clock signal CK. According to an embodiment, the plurality of internal clock signals CK_INTS may have the same frequencies and different phases with one another. For example, similarly to the illustration of FIG. 5, the clock divider 142 may generate four internal clock signals CK_INTS having a frequency that is ¼ of a frequency of the clock signal CK, and the four internal clock signals CK_INTS may have a phase difference of 90° with one another. As another example, the clock divider 142 may generate two internal clock signals CK_INTS having a frequency that is ½ of the frequency of the clock signal CK, and the two internal clock signals CK_INTS may have a phase difference of 180° with respect to each other.

The clock selector 144 may select one of the plurality of internal clock signals CK_INTS generated by the clock divider 142 and output the selected internal clock signal as the internal clock signal CK_INT, in response to the phase selection signal PS generated by the memory controller 200b or 200c. For example, when the number of internal clock signals CK_INTS generated by the clock divider 142 is four, the phase selection signal PS may be a 2 bit signal received through two signal lines, and the clock selector 144 may select one of the four internal clock signals CK_INTS and output the selected internal clock signal as the internal clock signal CK_INT in response to the phase selection signal PS.

FIG. 11 is an exemplary timing diagram of signals transferred between the memory device 100c and the memory controller 200c of FIG. 9B during command bus training, according to an exemplary embodiment. FIG. 11 is the timing diagram corresponding to the example of FIG. 9B in which the phase selection signal PS is transferred through one signal line (that is, DQ [7]) of the data bus 17. Alternatively, in the example of FIG. 9A in which the phase selection signal PS is transferred through an additional signal line, the signals are transferred similarly to the example of FIG. 11. Hereinafter, FIG. 11 will be described with reference to FIGS. 9B and 10.

Referring to FIG. 11, the clock divider 142 of the internal clock generator 140c may generate two internal clock signals CK_INT1 and CK_INT2 having a frequency that is ½ of a frequency of the clock signal CK. The two internal clock signals CK_INT1 and CK_INT2 may have a phase difference of 180° with respect to each other, and the clock selector 144 may select one of the two internal clock signals CK_INT1 and CK_INT2 and output the selected internal clock signal in response to the phase selection signal PS.

At Ta0 through Ta12, a first internal clock signal CK_INT1 may be selected and output to the outside of the internal clock generator 140c, in response to the phase selection signal PS of a low level, and the command/address latch 120c may sample a chip selection signal CS at a rising edge of the first internal clock signal CK_INT1. As illustrated in FIG. 11, an active pulse of the chip selection signal CS received from the memory controller 200c may be sampled at Ta2, and thus, the command/address latch 120c may latch a first command/address signal CA1 having Pattern F1, and may output a second command/address signal CA2 having Pattern F2.

Also, at Tb0 through Tb12, a second internal clock signal CK_INT2 may be selected and output to the outside of the internal clock generator 140c, in response to the phase selection signal PS of a high level, and the command/address latch 120c may sample the chip selection signal CS at a rising edge of the second internal clock signal CK_INT2. As illustrated in FIG. 11, an active pulse of the chip selection signal CS received from the memory controller 200c may be sampled at Tb3, and thus, the command/address latch 120c may latch a first command/address signal CA1 having Pattern G1, and may output a second command/address signal CA2 having Pattern G2.

As illustrated in FIG. 11, the internal clock signal capturing the chip selection signal CS and the first command/address signal CA1 may be determined in response to the phase selection signal PS provided by the memory controller 120c. Accordingly, in the case where the rising edge of the internal clock signal CK_INT divided from the clock signal CK does not occur in a range within which the memory controller 120c changes a delay of the chip selection signal CS, so that the second command/address signal CA2 having the pattern identical to the pattern of the first command/address signal CA1 is not received, or in the case where the rising edge of the internal clock signal CK_INT occurs near a boundary of the range within which the memory controller 120c changes the delay of the chip selection signal CS so that an optimal timing of the chip selection signal CS is not found, the memory controller 120c may change a phase of the internal clock signal CK_INT sampling the chip selection signal CS, by changing the phase selection signal PS.

Figure 12:
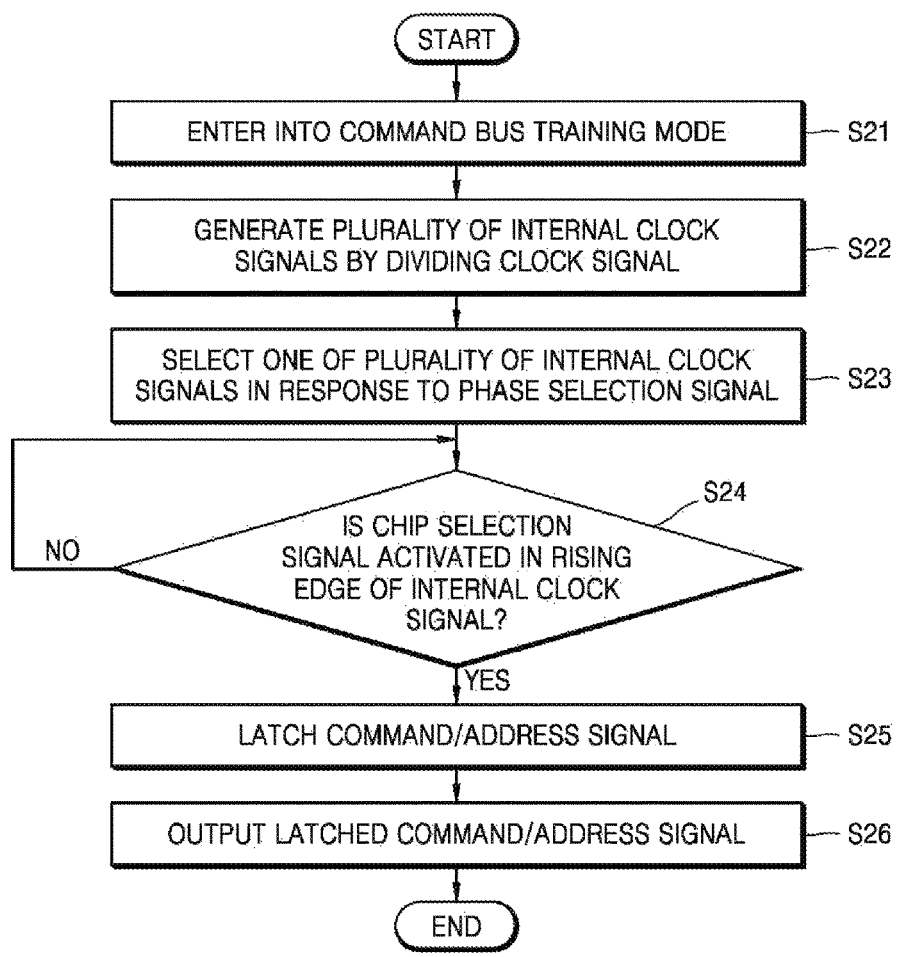
FIG. 12 is a flowchart of an operating method of the memory device of FIG. 9A or FIG. 9B, according to exemplary embodiments.

FIG. 12 is a flowchart of an operating method of the memory device 100b or 100c of FIG. 9A or 9B, according to example embodiments. As illustrated in FIG. 12, the operating method of the memory device 100b or 100c may include operations S21 through S26. Hereinafter, FIG. 12 will be described with reference to FIG. 9A.

In operation S21, an operation of entering into a command bus training mode may be performed. For example, the memory controller 200b may transmit a command for entering into a command bus training mode to the memory device 100b, and the memory device 100b may enter into the command bus training mode in response to the received command.

In operation S22, an operation of generating a plurality of internal clock signals CK_INTS by dividing the clock signal CK may be performed. For example, the clock divider 142 included in the internal clock generator 140b may generate the plurality of internal clock signals CK_INTS having the same frequencies and having different phases with respect to each other.

In operation S23, an operation of selecting one of the plurality of internal clock signals CK_INTS in response to the phase selection signal PS may be performed. For example, the clock selector 144 included in the internal clock generator 140b may receive the phase selection signal PS, and may output one of the plurality of internal clock signals CK_INTS as the internal clock signal CK_INT in response to the received phase selection signal PS.

In operation S24, an operation of determining whether the chip selection signal CS is activated or not at a rising edge (or a falling edge) of the internal clock signal CK_INT may be performed. When the chip selection signal CS is activated at the rising edge of the internal clock signal CK_INT, an operation of latching a command/address signal may be performed in operation S25. For example, the command/address latch 120b of the memory device 100b may receive the chip selection signal CS, the first command/address signal CA1, and the internal clock signal CK_INT, and when the chip selection signal CS is activated at the rising edge of the internal clock signal CK_INT, the command/address latch 120b of the memory device 100b may latch the first command/address signal CA1 to generate the second command/address signal CA2.

In operation S26, an operation of outputting the latched command/address signal may be performed. For example, the data input/output circuit 160b of the memory device 100b may receive the second command/address signal CA2 from the command/address latch 120b, and may transmit the second command/address signal CA2 to the memory controller 200b through some signal lines of the data bus 17.

Figure 13A:
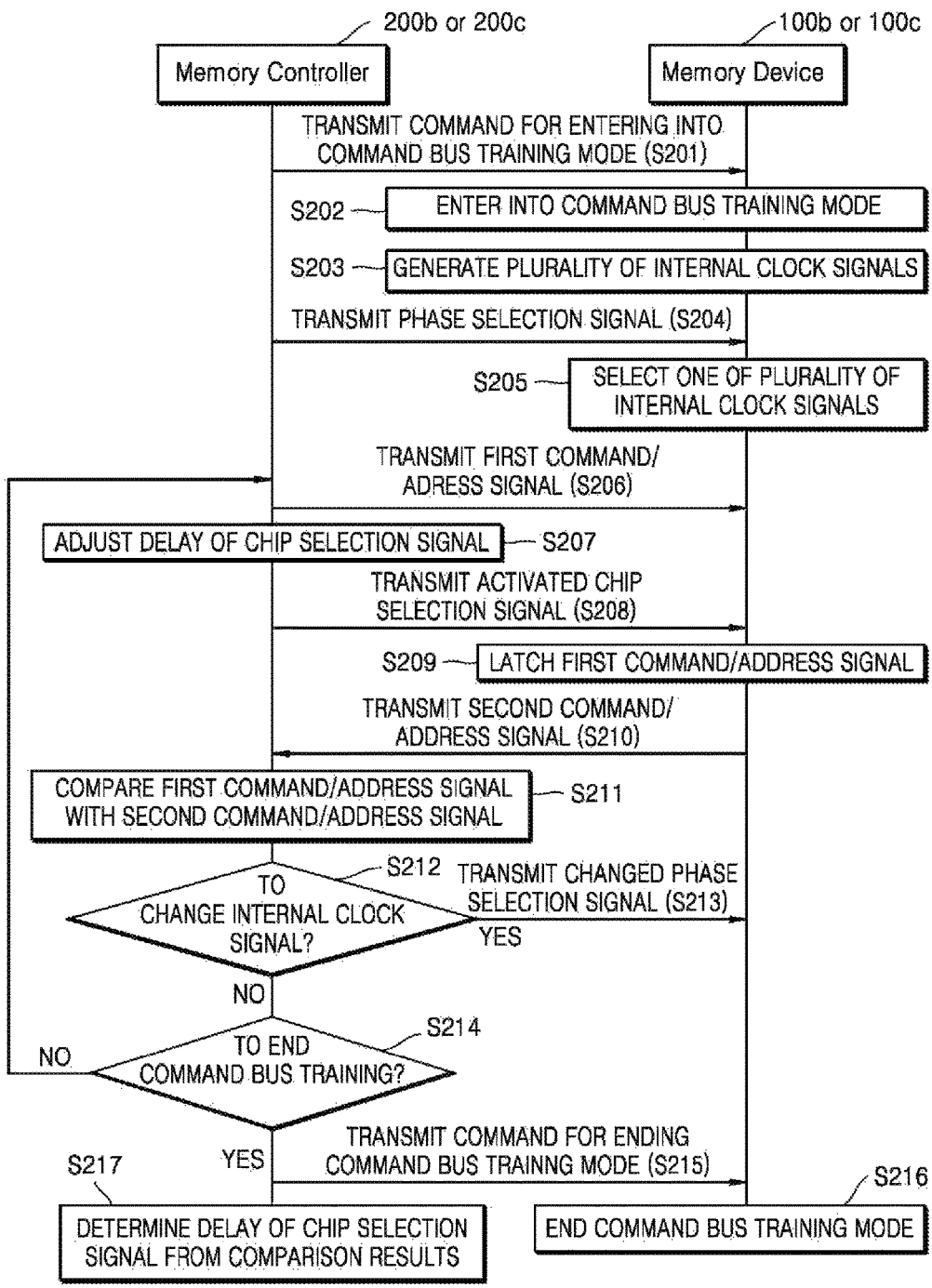
FIG. 13A is a diagram for describing an operation between the memory device and the memory controller of FIG. 9A or 9B according to the passage of time, according to exemplary embodiments.

FIG. 13A is a diagram for describing an operation between the memory device 100b or 100c and the memory controller 200b or 200c of FIG. 9A or 9B according to the passage of time, according to example embodiments. Hereinafter, FIG. 13A will be described with reference to FIG. 9A.

The memory controller 200b may transmit the command for entering into the command bus training mode in operation S201. The memory device 100b may enter into the command bus training mode in response to the received command in operation S202. The memory device 100b may generate the plurality of internal clock signals CK_INTS by dividing the clock signal CK received from the memory controller 200b, in operation S203. The plurality of internal clock signals may have different phases from one another.

The memory controller 200b may transmit the phase selection signal PS in operation S204. For example, the memory controller 200b may transmit the phase selection signal PS through, for example, a data mask pad (or data mask pin) which is not used in the command bus training mode, and the memory device 100b may receive the phase selection signal PS through the data mask pad and select one of the plurality of internal clock signals in response to the received phase selection signal in operation S205.

The memory controller 200b may transmit the first command/address signal CA1 in operation S206. For example, the memory controller 200b may transmit the first command/address signal CA1 having a specific pattern (e.g., active, precharge, refresh, read, write, etc.). Then, the memory controller 200b may adjust a delay of the chip selection signal CS in operation S207. For example, the memory controller 200b may adjust a delay of an active pulse of the chip selection signal CS to gradually increase or decrease. The memory controller 200b may transmit the activated chip selection signal CS in operation S208. For example, the memory controller 200b may transmit the active pulse of the chip selection signal CS according to the adjusted delay.

When the memory device 100b samples the chip selection signal CS activated at a rising edge (or, falling edge) of the internal clock signal CK_INT, the memory device 100b may latch the first command/address signal CA1 in operation S209. The memory device 100b may generate the second command/address signal CA2 by latching the first command/address signal CA1, and may transmit the second command/address signal CA2 to the memory controller 200b in operation S210.

The memory controller 200b may compare the first command/address signal CA1 with the second command/address signal CA2 in operation S211, and may accumulate results of the comparison. The memory controller 200b may determine whether to change the internal clock signal CK_INT in operation S212. For example, as described above with reference to FIG. 11, when it is difficult to determine an optimal timing of the chip selection signal CS by using a first internal clock signal CK_INT, the memory controller 200b may determine to change the first internal clock signal CK_INT into a second internal clock signal CK_INT having a different phase (e.g., 180°) with respect to the first internal clock signal CK_INT, and may transmit a changed phase selection signal in operation S213.

The memory controller 200b may determine whether to end the command bus training in operation S214. For example, the memory controller 200b may determine whether the delay of the chip selection signal CS is adjusted to a maximum value (or a minimum value) which is adjustable. Alternatively, the memory controller 200b may determine whether the delay of the chip selection signal CS may be determined based on the accumulated results of the comparison. When the command bus training is not ended, the memory controller 200b may repeat to transmit the first command/address signal CA1 in operation S206. For example, the first command/address signal CA1 may have a different pattern from the previous first command/address signal CA1. On the other hand, when the command bus training is ended, the memory controller 200b may transmit a command for ending the command bus training mode to the memory device 100b in operation S215. The memory device 100b may end the command bus training mode in response to the received command in operation S216.

The memory controller 200b may determine the delay of the chip selection signal CS based on the accumulated results of the comparison in operation S217. For example, as illustrated in FIG. 6, the memory controller 200b may select the delay of the chip selection signal CS corresponding to a middle of the CS pass window (e.g., (c) of FIG. 6).

Figure 13B:
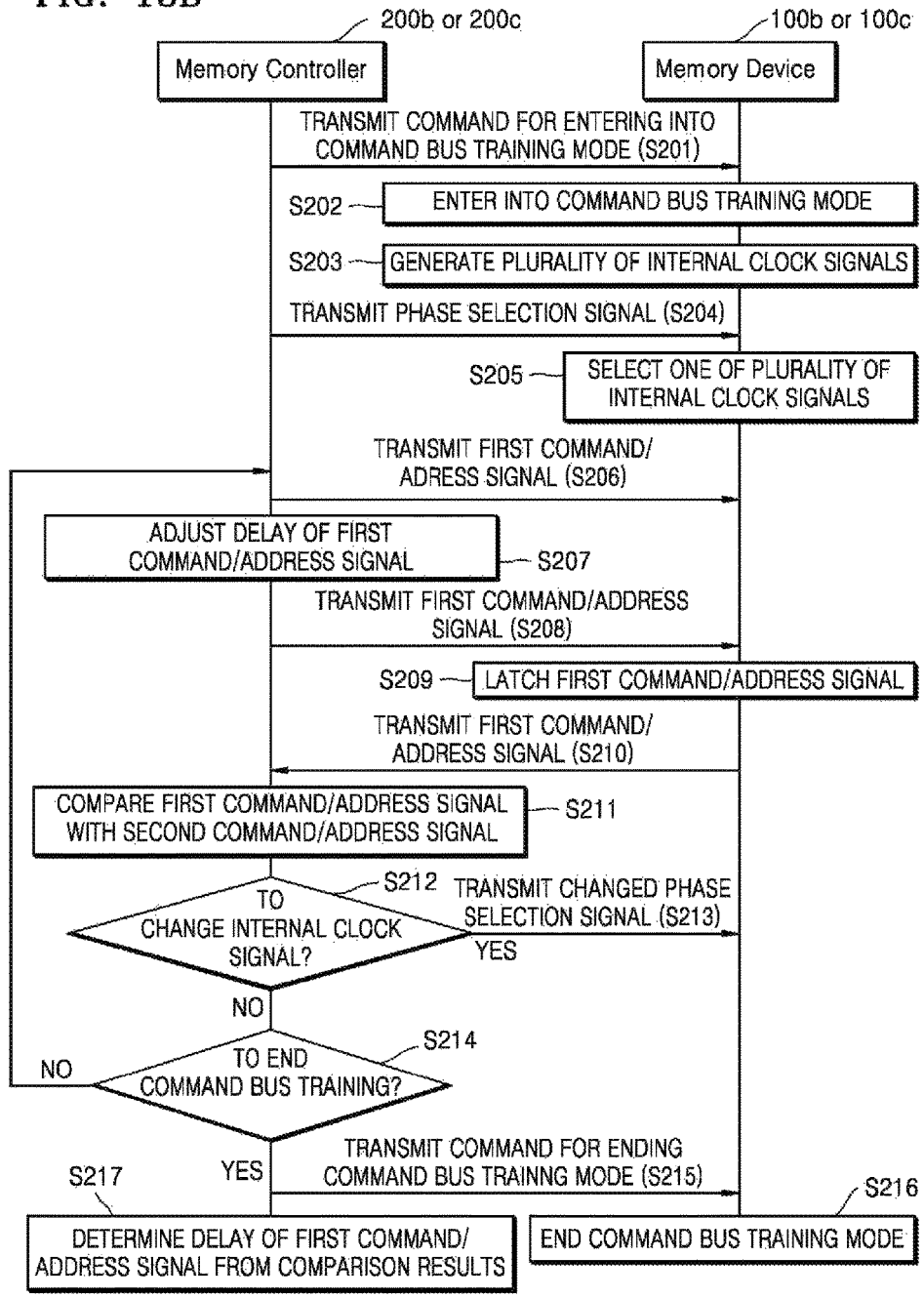
FIG. 13B is a diagram for describing an operation between the memory device and the memory controller of FIG. 9A or 9B according to exemplary embodiments.

FIG. 13B is a diagram for describing an operation between the memory device 100b or 100c and the memory controller 200b or 200c of FIG. 9A or 9B according to example embodiments. Hereinafter, FIG. 13B will be described with reference to FIG. 9A.

The memory controller 200b may transmit the command for entering into the command bus training mode in operation S201. The memory device 100b may enter into the command bus training mode in response to the received command in operation S202. The memory device 100b may generate the plurality of internal clock signals CK_INTS by dividing the clock signal CK received from the memory controller 200b, in operation S203. The plurality of internal clock signals may have different phases from one another.

The memory controller 200b may transmit the phase selection signal PS in operation S204. For example, the memory controller 200b may transmit the phase selection signal PS through, for example, a data mask pad (or data mask pin) which is not used in the command bus training mode, and the memory device 100b may receive the phase selection signal PS through the data mask pad and select one of the plurality of internal clock signals in response to the received phase selection signal in operation S205.

The memory controller 200b may transmit the first command/address signal CA1 in operation S206. For example, the memory controller 200b may transmit the first command/address signal CA1 having a specific pattern (e.g., active, precharge, refresh, read, write, etc.). Then, the memory controller 200b may adjust a delay of the first command/address signal CA1 in operation S207. For example, the memory controller 200b may adjust a delay of the first command/address signal CA1 to gradually increase or decrease. In example embodiments, one or more signals of the first command/address signal CA1 may be adjusted by the delay in operation S207. The memory controller 200b may transmit the first command/address signal CA1 in operation S208. For example, the memory controller 200b may transmit the first command/address signal CA1 according to the adjusted delay.

When the memory device 100b samples the first command/address signal CA1 at a rising edge (or, falling edge) of the internal clock signal CK_INT, the memory device 100b may latch the first command/address signal CA1 in operation S209. The memory device 100b may generate the second command/address signal CA2 by latching the first command/address signal CA1, and may transmit the second command/address signal CA2 to the memory controller 200b in operation S210.

The memory controller 200b may compare the first command/address signal CA1 with the second command/address signal CA2 in operation S211, and may accumulate results of the comparison. The memory controller 200b may determine whether to change the internal clock signal CK_INT in operation S212. For example, as described above with reference to FIG. 11, when it is difficult to determine an optimal timing of the first command/address signal CA1 by using a first internal clock signal CK_INT, the memory controller 200b may determine to change the first internal clock signal CK_INT into a second internal clock signal CK_INT having a different phase (e.g., 180°) with respect to the first internal clock signal CK_INT, and may transmit a changed phase selection signal in operation S213.

The memory controller 200b may determine whether to end the command bus training in operation S214. For example, the memory controller 200b may determine whether the delay of the first command/address signal CA1 is adjusted to a maximum value (or a minimum value) which is adjustable. Alternatively, the memory controller 200b may determine whether the delay of the first command/address signal CA1 may be determined based on the accumulated results of the comparison. When the command bus training is not ended, the memory controller 200b may repeat to transmit the first command/address signal CA1 in operation S206. For example, the first command/address signal CA1 may have a different pattern from the previous first command/address signal CA1. On the other hand, when the command bus training is complete, the memory controller 200b may transmit a command for ending the command bus training mode to the memory device 100b in operation S215. The memory device 100b may end the command bus training mode in response to the received command in operation S216.

The memory controller 200b may determine the delay of the first command/address signal CA1 based on the accumulated results of the comparison in operation S217. For example, as illustrated in FIG. 6, the memory controller 200b may select the delay of the first command/address signal CA1 corresponding to a middle of the first command/address signal CA1 pass window (e.g., (c) of FIG. 6)

Figure 14:
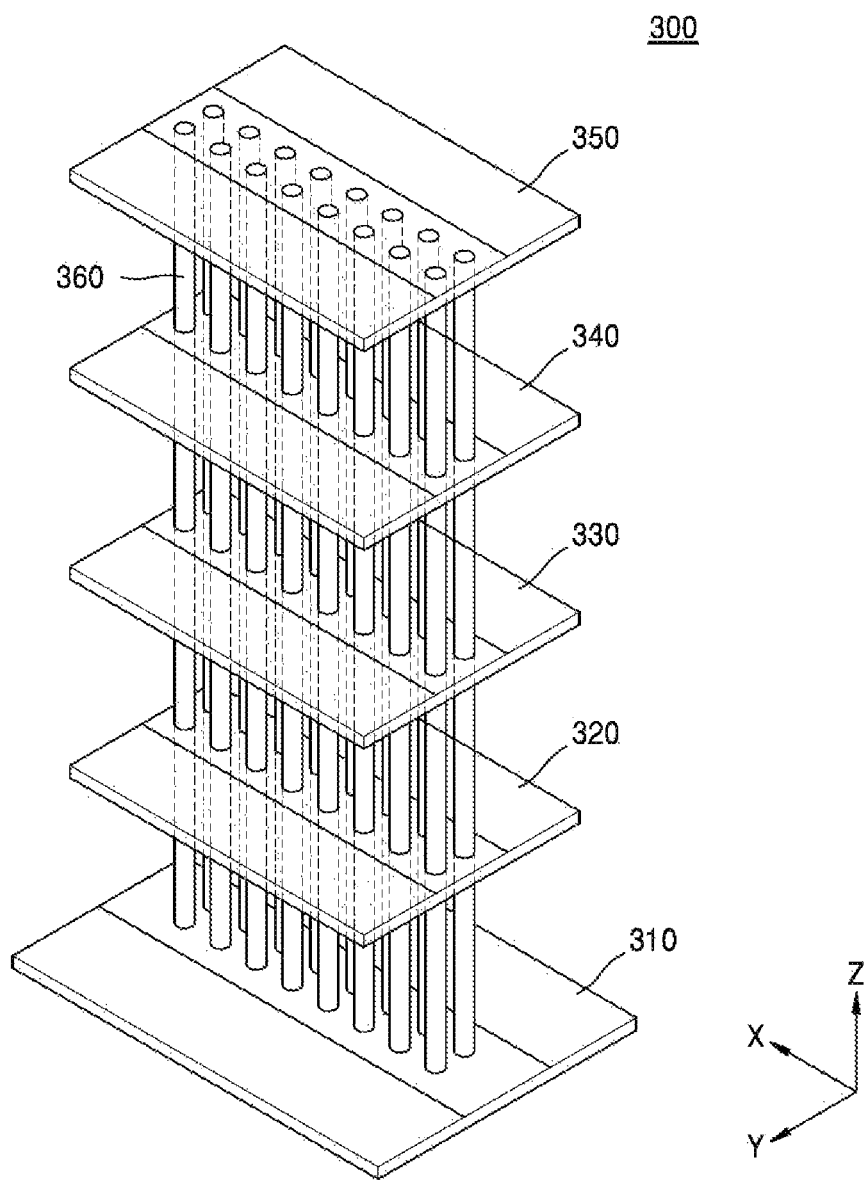
FIG. 14 is a view of an example of a semiconductor device according to a certain embodiment.

FIG. 14 is a view of an example of a semiconductor device according to a certain embodiment. According to the present embodiment, the semiconductor device 300 may include a plurality of stacked semiconductor chips 310 through 350. For example, as illustrated in FIG. 14, the semiconductor device 300 may be a memory device, and may include an interface chip 310 and a plurality of memory chips 320 through 350. Each of the memory chips 320 through 350 may be one of the memory devices 100, 100b, 100a, and 100c disclosed herein. The interface chip 310 and the plurality of memory chips 320 through 350 may be connected to one another through through-substrate vias (e.g., through-silicon vias) TSVs 360.

Each of the plurality of memory chips 320 through 350 may include a memory cell array, and the interface chip 310 may include a command/address latch, an internal clock generator, and a data input/output circuit. The command/address latch included in the interface chip 310 may operate as the command/address latch 120a, 120b, or 120c according to the above-described exemplary embodiments. For example, the internal clock signal CK_INT may be generated by dividing the clock signal CK received from the outside of the semiconductor device 300, and the internal clock signal CK_INT may be used to capture the chip selection signal CS and the first command/address signal CA1.

Figure 15:
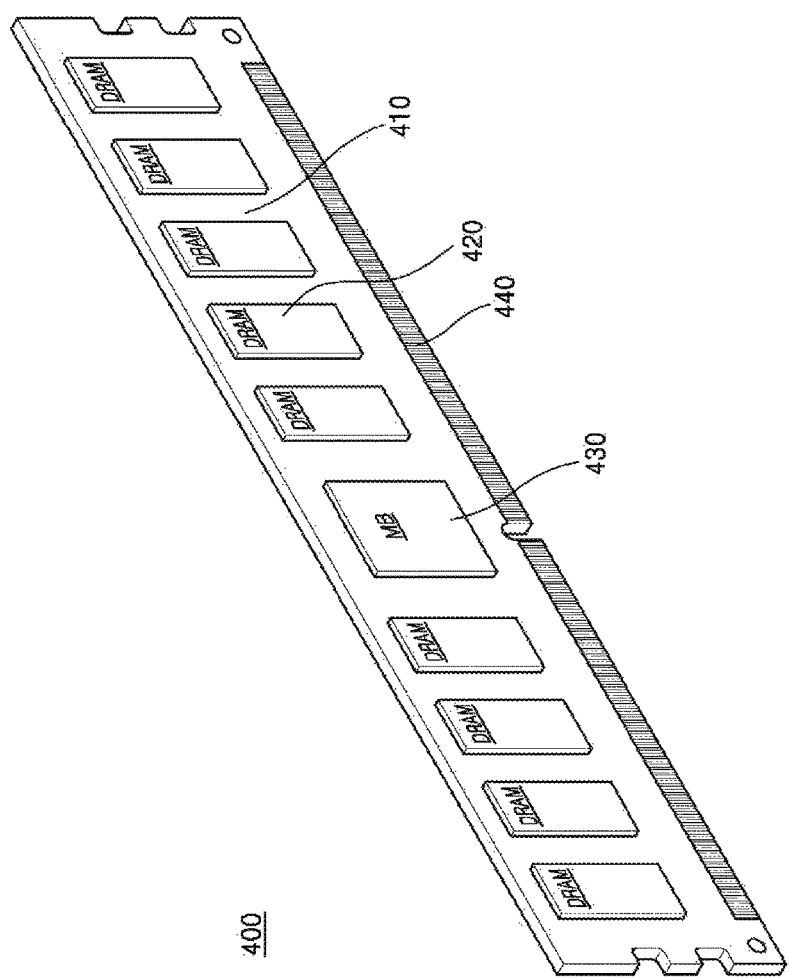
FIG. 15 is a view of a memory module including a memory device according to a certain embodiment.

FIG. 15 is a view of a memory module 400 including a memory device according to an exemplary embodiment. The memory module 400 may be applied to a single in-line memory module (SIMM), a dual in-line memory module (DIMM), a small-outline DIMM (SO-DIMM), an unbuffered DIMM (UDIMM), a fully-buffered DIMM (FB-DIMM), a rank-buffered DIMM (RBDIMM), a load-reduced DIMM (LRDIMM), a mini-DIMM, a micro-DIMM, etc.

As illustrated in FIG. 15, the memory module 400 may include a printed circuit board 410, a plurality of memory chips 420, a buffer chip 430, and a connector 440. The plurality of memory chips 420 and the buffer chip 430 may communicate with a memory controller outside the memory module 400 by the connector 440.

Each of the plurality of memory chips 420 may be one of the memory devices 100, 100b, 100a, and 100c disclosed herein. Each of the plurality of memory chips 420 may include a command/address latch, an internal clock generator, and a data input/output circuit. The command/address latch, the internal clock generator, and the data input/output circuit may operate according to the exemplary embodiments. That is, the internal clock signal CK_INT may be generated by dividing the clock signal CK received from the outside of the memory module 400, and the internal clock signal CK_INT may be used to capture the chip selection signal CS and the first command/address signal CA1.

The buffer chip 430 may communicate with the plurality of memory chips 420 and may temporarily store data received from the outside of the memory module 400 or data transmitted to the outside of the memory module 400.

Figure 16:
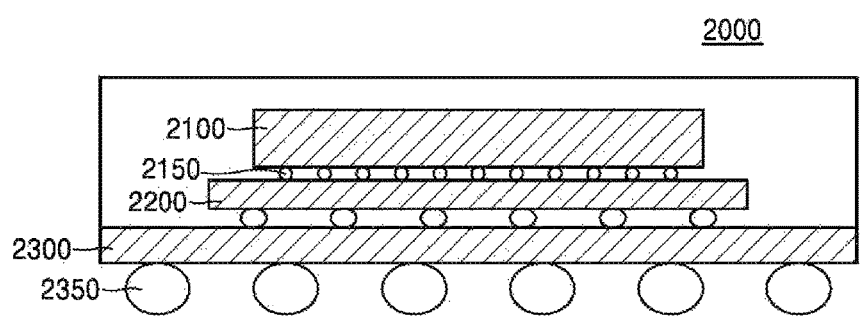
FIG. 16 is a cross-sectional view of a package including a memory device and a memory controller according to a certain embodiment.

FIG. 16 is a cross-sectional view of a package 2000 including a memory device 2100 and a memory controller 2200 according to an exemplary embodiment. According to the present embodiment, the memory device 2100 and the memory controller 2200 may be included in the package 2000.

The package 2000 may include, but is not limited to, a package on package (PoP), ball grid arrays (BGAs), chip scale packages (CSPs), a plastic leaded chip carrier (PLCC), a plastic dual in-line package (PDIP), a chip on board (COB), a ceramic dual in-line package (CERDIP), a plastic metric quad flat pack (MQFP), a thin quad flat pack (TQFP), a small-outline integrated circuit (SOIC), a shrink small outline package (SSOP), a thin small outline (TSOP), a system in package (SIP), a multi chip package (MCP), a wafer-level package (WLP), or a wafer-level processed stack package (WSP).

Referring to FIG. 16, the memory device 2100 and the memory controller 2200 may be realized as different chips, and may be stacked on a package substrate 2300. The memory device 2100 and the memory controller 2200 may be electrically connected to each other through micro-bumps 2150, and the memory controller 2200 and the package substrate 2300 may be electrically connected to each other through flip-chip bumps 2250. Package bumps 2350 exposed to the outside of the package 2000 may be bonded to the package substrate 2300, and the package substrate 2300 may be electrically connected to patterns formed on a printed circuit board (not shown), on which the package 2000 is mounted.

The memory device 2100 may be one of the memory devices 100, 100b, 100a, and 100c disclosed herein. The memory device 2100 may include a command/address latch, an internal clock generator, and a data input/output circuit, and the command/address latch, the internal clock generator, and the data input/output circuit may operate according to the exemplary embodiments. That is, the internal clock signal CK_INT may be generated by dividing the clock signal CK received from the memory controller 2200, and the internal clock signal CK_INT may be used to capture the chip selection signal CS and the first command/address signal CA1.

The memory controller 2200 may determine a timing of the chip selection signal CS based on the first command/address signal CA1 transmitted to the memory device 2100 and the second command/address signal CA2 received from the memory device 2100. According to an exemplary embodiment, the memory controller 2200 may be a processor, and the memory device 2100 may function as a data memory of the processor.

Figure 17:
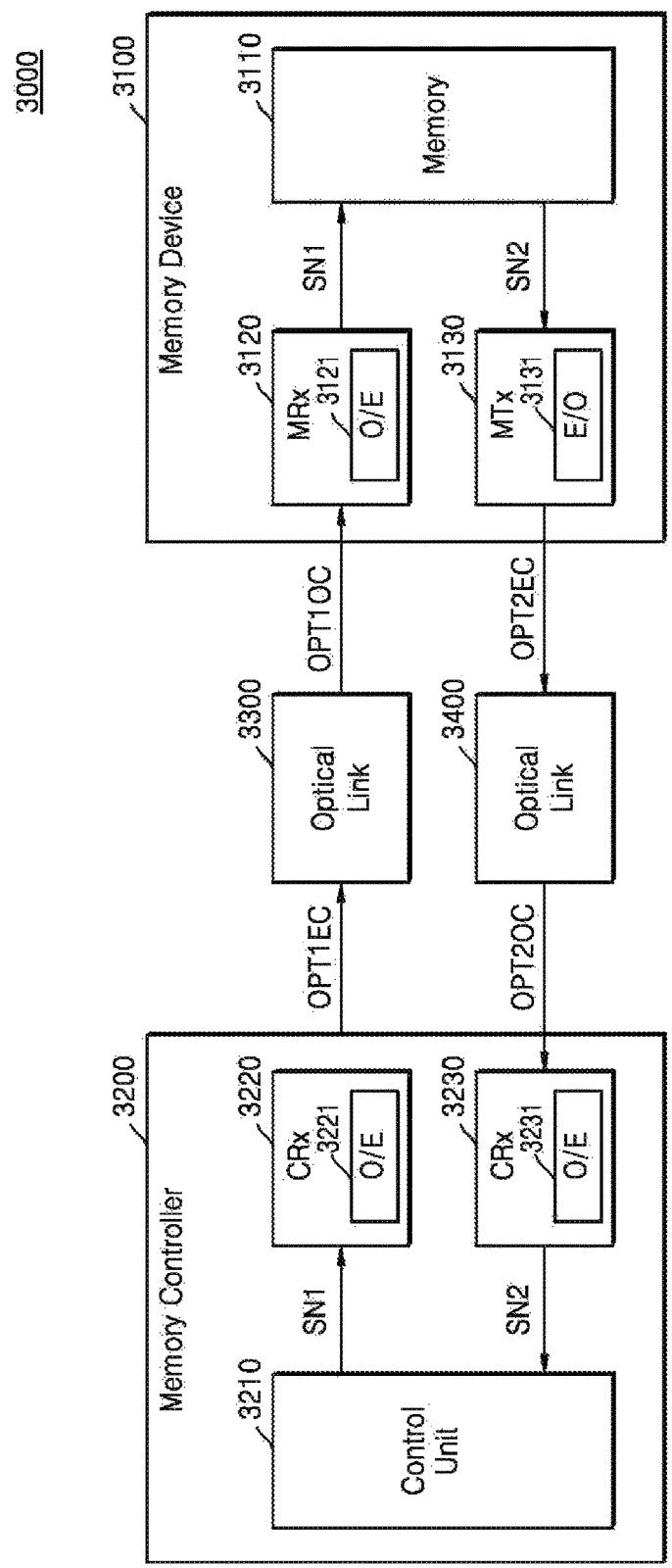
FIG. 17 is a block diagram of a system including a memory device and a memory controller according to a certain embodiment.

FIG. 17 is a block diagram of a system 3100 including a memory device 3100 and a memory controller 3200 according to an exemplary embodiment. As illustrated in FIG. 17, the system 3000 may include the memory device 3100, the memory controller 3200, and optical links 3300 and 3400, and the optical links 3300 and 3400 may inter-connect the memory device 3100 and the memory controller 3200.

The memory controller 3200 includes a control unit 3210, a first transmitter 3220, and a first receiver 3230. The control unit 3210 transmits a first electrical signal SN1 to the first transmitter 3220. The first electrical signal SN1 may include the first command/address signal CA1, the clock signal CK, and the chip selection signal CS transmitted to the memory device 3100.

The first transmitter 3220 may include a first optical modulator 3221, and the first optical modulator 3221 may convert the first electrical signal SN1 into a first optical transmission signal OTP1EC and transmit the first optical transmission signal OTP1EC to the optical link 3300. The first optical transmission signal OTP1EC may be transmitted via serial communication through the optical link 3300. The first receiver 3230 may include a first optical demodulator 3231, and the first optical demodulator 3231 may convert a second optical reception signal OPT2OC received from the optical link 3400 into a second electrical signal SN2 and transmit the second electrical signal SN2 to the control unit 3210. The second electrical signal SN2 may include the second command/address signal CA2 and the data signal DQ. The control unit 3210 may operate according to the exemplary embodiments. That is, the control unit 3210 may transmit the first command/address signal CA1 to the memory device 3100, adjust a timing of the chip selection signal CS, and determine an optimal timing of the chip selection signal CS based on the first command/address signal CA1 and the second command/address signal CA2 received from the memory device 3100. Also, according to an exemplary embodiment, the control unit 3210 may generate the phase selection signal PS and transmit the phase selection signal PS to the memory device 3100.

The memory device 3100 may include a second receiver 3120, memory (e.g., DRAM) 3110 including a memory cell array and a peripheral circuit, and a second transmitter 3130. The second receiver 3120 may include a second optical demodulator 3121, and the second optical demodulator 3121 may convert the first optical reception signal OPT1OC received from the optical link 3300 into the first electrical signal SN1 and transmit the first electrical signal SN1 to the DRAM 3110.

The DRAM 3110 may write data to the memory cell in response to the first electrical signal SN1 or transmit data read from a memory area 3110 to the second transmitter 3130 as the second electrical signal SN2. The first electrical signal SN1 may include the first command/address signal CA1, the clock signal CK, and the chip selection signal CS. The DRAM 3110 may be one of the memory devices 100, 100b, 100a, and 100c disclosed herein. The DRAM 3110 may include the command/address latch, the internal clock generator, and the data input/output circuit according to the exemplary embodiments. That is, the internal clock signal CK_INT may be generated by dividing the clock signal CK received from the memory controller 3200, and the internal clock signal CK_INT may be used to capture the chip selection signal CS and the first command/address signal CA1.

The second electrical signal SN2 may include the second command/address signal CA2 transmitted to the memory controller 3200, data DQ, etc. The second transmitter 3130 may include a second optical modulator 3131, and the second optical modulator 3131 may convert the second electrical signal SN2 into a second optical transmission signal OPT2EC and transmit the second optical transmission signal OPT2EC to the optical link 3400. The second optical transmission signal OTP2EC may be transmitted via serial communication through the optical link 3400.

Figure 18:
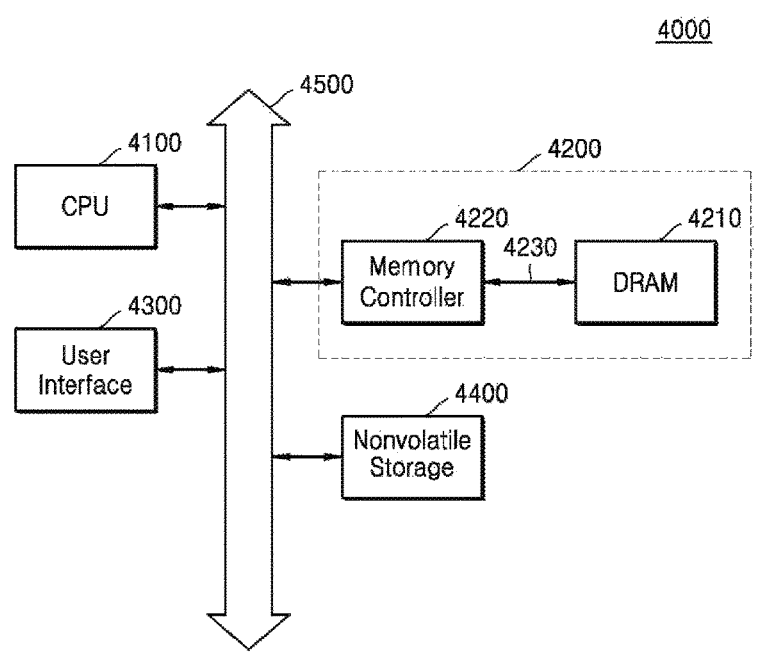
FIG. 18 is a block diagram of a computing system according to a certain embodiment.

FIG. 18 is a block diagram of a computing system 4000 according to an exemplary embodiment. As illustrated in FIG. 18, the computing system 4000 may include a central processing device 4100, a memory system 4200, a user interface 4300, and a non-volatile storage device 3400. The central processing device 4100, the memory system 4200, the user interface 4300, and the non-volatile storage 4400 may communicate with one another through a bus 4500. Although it is not illustrated in FIG. 18, the computing system 4000 may further include ports that may communicate with a video card, a sound card, a memory card, a universal serial bus (USB) device, or other electronic devices. The computing system 4000 may be realized as a personal computer, or portable electronic devices, such as laptop computers, cellular phones, personal digital assistants (PDAs), and cameras.

The central processing device 4100 may perform specific calculations or tasks. According to an exemplary embodiment, the central processing device 4100 may be a microprocessor, a graphics processing unit (GPU), etc. The central processing device 4100 may communicate with the memory system 4200, the user interface 4300, and the non-volatile storage 4400 through the bus 4500. The central processing device 4100 may be connected to an expansion bus, such as a peripheral component interconnect (PCI) bus.

The memory system 4200 may include a DRAM 4210 and a memory controller 4220, and may store data necessary for an operation of the computing system 4000. For example, the memory system 4200 may function as a data memory of the central processing device 4100, and may support direct memory access (DMA) to store data received from the bus 4500 or transmit the stored data to the bus 4500. The memory devices according to the exemplary embodiments may be included in the memory system 4200 as the DRAM 4210, and the memory controller 4220 may be included in the memory system 4200. The DRAM 4210 and the memory controller 4220 may operate according to the exemplary embodiments. For example, the internal clock signal CK_INT may be generated by dividing the clock signal CK received from the memory controller 4220, and the internal clock signal CK_INT may be used to capture the chip selection signal CS and the first command/address signal CA1.

The user interface 4300 may include input devices, such as a keyboard, a keypad, a mouse, etc. to receive an input signal from a user, and may include output devices, such as a printer, a display device, etc. to provide an output signal to the user.

The non-volatile storage 4400 may include non-volatile semiconductor memory devices, such as EEPROM, flash memory, PRAM, RRAM, NFGM, PoRAM, MRAM, FRAM, etc., and may also include a magnetic disk.

While the present disclosure has been particularly shown and described with reference to embodiments thereof, it will be understood that various changes in form and details may be made therein without departing from the spirit and scope of the following claims.

What is claimed is:

1. A command bus training method in a system in which a command/address signal and a clock signal are provided to a memory device from a memory controller, the command bus training method comprising:
   entering into a command bus training mode at the memory device;
   generating an internal clock signal in the memory device by dividing the clock signal;
   transmitting a first command/address signal by the memory controller;
   transmitting a chip selection signal by the memory controller, the chip selection signal having an adjustable delay with respect to the internal clock signal;
   generating and transmitting by the memory device, a second command/address signal by latching the first command/address signal at a rising edge or a falling edge of the internal clock signal, when the chip selection signal is activated;
   comparing the first command/address signal with the second command/address signal by the memory controller; and
   determining a delay of the chip selection signal based on a plurality of comparison results corresponding to the adjustable delay of the chip selection signal.

2. The command bus training method of claim 1, wherein transmitting the chip selection signal comprises gradually changing the delay of the chip selection signal.

3. The command bus training method of claim 1, wherein determining the delay of the chip selection signal comprises determining median value of delays of the chip selection signal corresponding to comparison results as the delay of the chip selection signal, whereby the first and second command/address signals correspond to each other.

4. The command bus training method of claim 1, further comprising transmitting a phase selection signal by the memory controller,
   wherein generating the internal clock signal comprises:
   generating a plurality of internal clock signals having different phases by dividing the clock signal, and
   selecting one of the plurality of internal clock signals in response to the phase selection signal.

5. The command bus training method of claim 4, wherein transmitting the phase selection signal comprises changing the phase selection signal such that a non-selected internal clock signal among the plurality of internal clock signals is selected.

6. The command bus training method of claim 4, wherein a command/address bus and a data bus are connected between the memory controller and the memory device, and
wherein the phase selection signal is transmitted through at least one signal line of the data bus or is transmitted to a data mask pad of the memory device.

7. The command bus training method of claim 4, wherein generating the plurality of internal clock signals comprises generating first and second internal clock signals having different phases by dividing the clock signal, and
wherein, in the generating and transmitting by the memory device, the second command/address signal, the second command/address signal includes a first second command/address signal generated based on the first internal clock signal, and a second second command/address signal generated based on the second internal clock signal.

8. The command bus training method of claim 7, wherein the first and second internal clock signals have a phase difference of 180° with respect to each other.

9. The command bus training method of claim 1, wherein the chip selection signal has an active pulse width that is equal to or less than a cycle of the clock signal.

10. An operating method of a memory device supporting command bus training, the operating method comprising:
entering into a mode of the command bus training;
receiving a clock signal, a chip selection signal and a first command/address signal;
generating first and second internal clock signals by dividing the clock signal, each of the first and second internal clock signals having the same frequency and different phases with respect to each other;
generating a second command/address signal by latching the first command/address signal at a rising edge or a falling edge of one of the first and second internal clock signals when the chip selection signal is activated; and
outputting the second command/address signal to an outside of the memory device,
wherein the generating of the first and second internal clock signals comprises selecting one of the first and second internal clock signals in response to a phase selection signal,
wherein the memory device is connected to a memory controller through a command/address bus and a data bus, and
wherein the phase selection signal is received through at least one signal line of the data bus or is transmitted to a data mask pad of the memory device.

11. The operating method of claim 10, wherein each of the first and second internal clock signals has a phase difference of 180° with respect to each other.

12. The operating method of claim 10,
wherein the first command/address signal is output through at least one signal line of the command/address bus, and
wherein the second command/address signal is output through at least one data line of the data bus.

13. A method of command bus training for a semiconductor device, the method comprising:
receiving a clock signal having a first frequency;
generating internal clock signals based on the clock signal, each of the internal clock signals having a second frequency and different phases with respect to each other, wherein the second frequency is smaller than the first frequency;
a) receiving a first command/address signal having variable delays with respect to a first internal clock signal of the internal clock signals;
b) generating a second command/address signal based on the first command/address signal and the first internal clock signal;
c) comparing the first command/address signal with the second command/address signal;
repeating a), b), and c) with a different delay of the variable delays; and
determining a delay of the first command/address signal based on the comparison results.

14. The method of claim 13, wherein the internal clock signals include the first internal clock signal and a second internal clock signal, the second internal clock signal has a phase difference of 180° with respect to the first internal clock signal, and
wherein receiving the first command/address signal further includes receiving the first command/address signal having variable delays with respect to the second internal clock signal.

15. The method of claim 13, wherein the semiconductor device is connected to a controller through a command/address bus that transmits a command signal or an address signal, and through a data bus that transmits data,
wherein receiving the first command/address signal includes receiving the first command/address signal from the controller through at least one signal line of the command/address bus, and
wherein generating the second command/address signal includes transmitting the second command/address signal through at least one data line of the data bus.

16. The method of claim 13, wherein one of the internal clock signals is selected in response to a control signal, and
wherein the control signal is received through a first data line of a data bus or a separated line.

17. The method of claim 13, wherein receiving the first command/address signal further includes receiving a chip selection signal having variable delays with respect to the first internal clock signal.

18. The method of claim 13, wherein the second frequency is ½ or ¼ frequency of the first frequency.

* * * * *